(12) United States Patent
Ota et al.

(10) Patent No.: US 11,114,565 B2
(45) Date of Patent: Sep. 7, 2021

(54) SEMICONDUCTOR DEVICE

(71) Applicant: National Institute of Advanced Industrial Science and Technology, Tokyo (JP)

(72) Inventors: Hiroyuki Ota, Ibaraki (JP); Shinji Migita, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 15 days.

(21) Appl. No.: 16/650,928

(22) PCT Filed: Sep. 11, 2018

(86) PCT No.: PCT/JP2018/033568
§ 371 (c)(1),
(2) Date: Mar. 26, 2020

(87) PCT Pub. No.: WO2019/065208
PCT Pub. Date: Apr. 4, 2019

(65) Prior Publication Data
US 2020/0243687 A1    Jul. 30, 2020

(30) Foreign Application Priority Data

Sep. 29, 2017  (JP) .............................. JP2017-191369

(51) Int. Cl.
*H01L 29/78*  (2006.01)
*H01L 29/40*  (2006.01)
(Continued)

(52) U.S. Cl.
CPC .... *H01L 29/78391* (2014.09); *H01L 23/5226* (2013.01); *H01L 23/5283* (2013.01);
(Continued)

(58) Field of Classification Search
CPC ......... H01L 29/78391; H01L 29/40111; H01L 23/5226; H01L 23/5283; H01L 23/53266;
(Continued)

(56) References Cited

U.S. PATENT DOCUMENTS

2004/0036126 A1    2/2004  Chau et al.
2004/0036127 A1    2/2004  Chau et al.
(Continued)

FOREIGN PATENT DOCUMENTS

| JP | H11354653 A | 12/1999 |
|---|---|---|
| WO | 2004019414 A1 | 3/2004 |
| WO | 2015059986 A1 | 4/2015 |

OTHER PUBLICATIONS

International Search Report for Serial No. PCT/JP2018/033568 dated Dec. 4, 2018.
(Continued)

*Primary Examiner* — Sheikh Maruf
(74) *Attorney, Agent, or Firm* — McCormick, Paulding & Huber PLLC

(57) ABSTRACT

Power consumption of a semiconductor device is reduced by sharpening the rise of a drain current when a gate voltage of a field effect transistor is less than a threshold voltage. As means therefor, in a fully-depleted MOSFET in which a thickness of a semiconductor layer serving as a channel region is 20 nm or less, a gate plug connected to a gate electrode is constituted of a first plug, a ferroelectric film, and a second plug sequentially stacked on the gate electrode. Here, an area where a contact surface between the first plug and the ferroelectric film and a contact surface between the ferroelectric film and the second plug overlap in a plan view is smaller than an area where the gate electrode and a semiconductor layer serving as an active region overlap.

11 Claims, 14 Drawing Sheets

(51) Int. Cl.
  *H01L 21/28* (2006.01)
  *H01L 23/522* (2006.01)
  *H01L 23/528* (2006.01)
  *H01L 23/532* (2006.01)
  *H01L 27/088* (2006.01)
  *H01L 27/1159* (2017.01)
  *H01L 29/06* (2006.01)
  *H01L 29/51* (2006.01)
  *H01L 29/66* (2006.01)

(52) U.S. Cl.
  CPC .... *H01L 23/5329* (2013.01); *H01L 23/53266* (2013.01); *H01L 27/0886* (2013.01); *H01L 27/1159* (2013.01); *H01L 29/0649* (2013.01); *H01L 29/0673* (2013.01); *H01L 29/40111* (2019.08); *H01L 29/516* (2013.01); *H01L 29/6684* (2013.01); *H01L 29/66795* (2013.01); *H01L 29/785* (2013.01)

(58) Field of Classification Search
  CPC ............. H01L 23/5329; H01L 27/0886; H01L 27/1159; H01L 29/0649; H01L 29/0673; H01L 29/516; H01L 29/66795; H01L 29/6684; H01L 29/785; H01L 29/42376; H01L 29/775; H01L 29/78654; H01L 29/78696; H01L 29/42392; H01L 29/786; B82Y 10/00
  USPC ......................................................... 257/295
  See application file for complete search history.

(56) References Cited

U.S. PATENT DOCUMENTS

| | | | |
|---|---|---|---|
| 2004/0036128 A1 | 2/2004 | Zhang et al. | |
| 2004/0094807 A1 | 5/2004 | Chau et al. | |
| 2004/0241916 A1 | 12/2004 | Chau et al. | |
| 2005/0151210 A1* | 7/2005 | Li | H01L 29/40111 257/410 |
| 2005/0156171 A1* | 7/2005 | Brask | H01L 27/0924 257/72 |
| 2005/0184316 A1* | 8/2005 | Kim | H01L 29/785 257/213 |
| 2005/0199949 A1 | 9/2005 | Chau et al. | |
| 2005/0199950 A1 | 9/2005 | Chau et al. | |
| 2005/0285226 A1* | 12/2005 | Lee | H01L 27/0688 257/535 |
| 2006/0024975 A1* | 2/2006 | Ahn | C23C 16/45529 438/778 |
| 2006/0033145 A1* | 2/2006 | Kakoschke | H01L 27/115 257/315 |
| 2006/0060857 A1* | 3/2006 | Mardilovich | H01L 29/7869 257/66 |
| 2006/0097345 A1* | 5/2006 | Marr | G11C 17/165 257/530 |
| 2006/0214231 A1* | 9/2006 | Shah | H01L 29/7854 257/347 |
| 2006/0228840 A1 | 10/2006 | Chau et al. | |
| 2007/0034972 A1 | 2/2007 | Chau et al. | |
| 2007/0131142 A1* | 6/2007 | Borland | C01G 23/006 106/287.19 |
| 2007/0281409 A1 | 12/2007 | Zhang et al. | |
| 2012/0326219 A1* | 12/2012 | Lu | H01L 27/10879 257/296 |
| 2013/0270619 A1* | 10/2013 | Schloesser | H01L 29/40111 257/295 |
| 2016/0308019 A1* | 10/2016 | Migita | H01L 21/02197 |
| 2016/0336312 A1 | 11/2016 | Yan et al. | |
| 2017/0162702 A1 | 6/2017 | Hu | |

OTHER PUBLICATIONS

S. Salahuddin and S. Datta "Use of Negative Capacitance to Provide Voltage Amplification for Low Power Nanoscale Devices", Nanoletters 2008, vol. 8, No. 2, pp. 405-410.

K.-S. Li et al., "Sub-60mV-Swing Negative-Capacitance FinFET without Hysteresis", Technical Digest of The 2015 International Electron Devices Meeting, pp. 620-623.

J. Zhou et al., "Ferroelectric HfZrOx Ge and GeSn PMOSFETs with Sub-60 mV/decade Subthreshold Swing, Negligible Hysteresis, and Improved IDS", Technical Digest of The 2016 International Electron Devices Meeting, pp. 311-314.

H. Fuketa et al., "Device-Circuit Interactions in Extremely Low Voltage CMOS Designs", Technical Digest of The 2011 International Electron Devices Meeting, pp. 559-562.

H. Ota et al., "Structural advantages of silicon-on-insulator FETs over FinFETs in steep subthreshold-swing operation in ferroelectric-gate FETs", Japanese Journal of Applied Physics 56, 04CD10 (2017).

Y. Taur and T. H. Ning "Fundamentals of Modern VLSI Devices", (Cambridge University Press, U. S, 1998), p. 128.

* cited by examiner

SEMICONDUCTOR DEVICE

CROSS-REFERENCE TO RELATED APPLICATIONS

This application is a National Stage application of International Patent Application No. PCT/JP2018/033568, filed on Sep. 11, 2018, which claims priority to Japanese Patent Application No. 2017-191369, filed on Sep. 29, 2017, each of which is hereby incorporated by reference in its entirety.

TECHNICAL FIELD

The present invention relates to a semiconductor device, and particularly relates to a technology effectively applied to a semiconductor device including a transistor.

BACKGROUND

In the field of IoT (Internet of Things), a device (sensor node) having no battery and including power generation means that supplies a weak power is used to achieve maintenance-free operation. For this reason, an LSI (Large Scale Integration) capable of performing signal amplification, analysis, transmission, and others with extremely low power consumption has been under development.

As a transistor with low power consumption, an SOI (Silicon-On-Insulator) transistor including a semiconductor layer formed over a semiconductor substrate via an insulating film is known.

In addition, as a transistor with low power consumption, a fin transistor (FINFET: Fin Field Effect Transistor) is also known. The fin transistor is, for example, a semiconductor element having a pattern of a plate-like (wall-like) semiconductor layer protruding on a substrate as a channel layer and having a gate electrode formed so as to straddle the pattern.

Further, in the field of nonvolatile storage device, it is known that a ferroelectric capable of maintaining a polarization state is used as a storage unit. Japanese Patent Application Laid-Open Publication No. H11-354653 describes a nonvolatile semiconductor storage device in which a ferroelectric film is formed over a floating gate electrode via a plug layer. Here, it is described that each of a floating gate electrode and a ferroelectric film formed over a so-called bulk silicon substrate via a gate oxide film is formed to have substantially the same planar area.

SUMMARY

In order to achieve the dramatic reduction in the power consumption of the currently realized LSI, it is conceivable to lower the power supply voltage by sharpening the rise of the drain current that changes exponentially with respect to the gate voltage below the threshold voltage. Sharpening the rise of the drain current means the reduction in the subthreshold coefficient (S coefficient). Here, as described in Y. Taur and T. H. Ning "Fundamentals of Modern VLSI Devices", (Cambridge University Press, U. S, 1998), p. 128, the S coefficient is defined as a gate voltage required to change the drain current by one order of magnitude at a gate voltage equal to or lower than the threshold voltage. However, H. Fuketa et al., "Device-Circuit Interactions in Extremely Low Voltage CMOS Designs", Technical Digest of The 2011 International Electron Devices Meeting, pp. 559-562 describes that the lower limit of the S coefficient is limited to 60 mV/decade as a physical limit in a known MOSFET (Metal-Oxide-Semiconductor Field-Effect-Transistor), and there is a problem that energy consumption rather increases if the threshold voltage is excessively lowered without reducing the S coefficient.

On the other hand, S. Salahuddin and S. Datta "Use of Negative Capacitance to Provide Voltage Amplification for Low Power Nanoscale Devices", Nanoletters 2008, Vol. 8, No. 2, pp. 405-410 describes that a negative capacitance state is conceivable in a ferroelectric and the S coefficient can be reduced by a negative capacitance MOSFET using a ferroelectric. Therefore, in order to reduce the S coefficient to less than 60 mV/decade, it is conceivable to use a ferroelectric in a negative capacitance state for a gate insulating film of a transistor.

However, H. Ota et al., "Structural advantages of silicon-on-insulator FETs over FinFETs in steep subthreshold-swing operation in ferroelectric-gate FETs", Japanese Journal of Applied Physics 56, 04CD10 (2017) reports that, in order to reduce the S coefficient to less than 60 mV/decade in such a transistor, it is necessary to adjust the effective remanent polarization value of the ferroelectric to about 1 $\mu C/cm2$. On the other hand, the remanent polarization value of a known ferroelectric material is about 5 to 30 $\mu C/cm2$. In fact, K. S. Li et al., "Sub-60 mV-Swing Negative-Capacitance FinFET without Hysteresis", Technical Digest of The 2015 International Electron Devices Meeting, pp. 620-623 and J. Zhou et al., "Ferroelectric HfZrOx Ge and GeSn PMOSFETs with Sub-60 mV/decade Subthreshold Swing, Negligible Hysteresis, and Improved IDS", Technical Digest of The 2016 International Electron Devices Meeting, pp. 311-314 report that the S coefficient cannot be reduced in the transistor in which a ferroelectric having a large remanent polarization value is used as a gate insulating film of the transistor as the experimental fact.

Other objects and novel features will be apparent from the description of this specification and the accompanying drawings.

The following is a brief description of an outline of a typical embodiment disclosed in this application.

A semiconductor device according to one embodiment includes a plug connected to a gate electrode of an SOI MOSFET, and the plug includes a first conductive connection portion, a second conductive connection portion on the first conductive connection portion, and a ferroelectric film interposed between the first conductive connection portion and the second conductive connection portion.

In addition, a semiconductor device according to one embodiment includes a plug connected to a gate electrode of a fin MOSFET, and the plug includes a first conductive connection portion, a second conductive connection portion on the first conductive connection portion, and a ferroelectric film interposed between the first conductive connection portion and the second conductive connection portion.

According to one embodiment disclosed in this application, the performance of a semiconductor device can be improved. In particular, the power consumption of the field effect transistor can be reduced by sharpening the rise of the drain current of the field effect transistor.

BRIEF DESCRIPTIONS OF THE DRAWINGS

DETAILED DESCRIPTION

Figure 1:
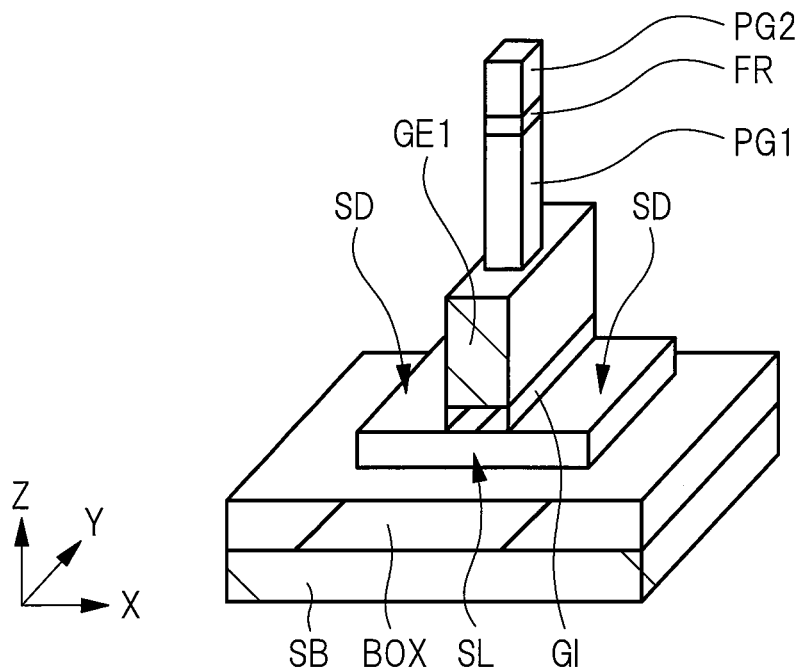
FIG. 1 is a perspective view showing a semiconductor device according to a first embodiment of the present invention.

Hereinafter, embodiments of the present invention will be described in detail with reference to the drawings. Components having the same function are denoted by the same reference characters throughout the drawings for describing the embodiments, and the repetitive description thereof will be omitted. In addition, description of the same or similar components will not be repeated in principle unless particularly required in the embodiments.

First Embodiment

<Structure of Semiconductor Device>

A semiconductor device according to the present embodiment will be described with reference to drawings.

Figure 2:
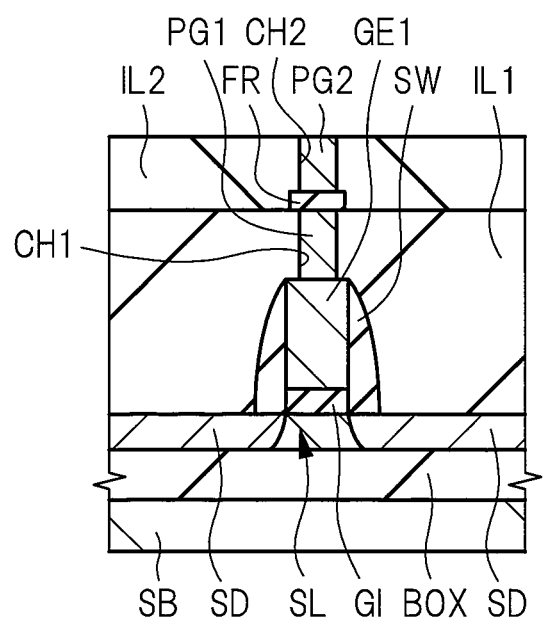
FIG. 2 is a cross-sectional view showing the semiconductor device according to the first embodiment of the present invention.

A structure of the semiconductor device according to the present embodiment will be described below with reference to FIG. 1 and FIG. 2. FIG. 1 is a perspective view showing the semiconductor device according to the present embodiment. FIG. 2 is a cross-sectional view showing the semiconductor device according to the present embodiment. FIG. 2 is a cross-sectional view taken along a plane in an X direction and a Z direction of the structure shown in FIG. 1. Illustrations of an element isolation region (element isolation film), an interlayer insulating film, plugs connected to source/drain regions, and sidewall spacers are omitted in FIG. 1.

As shown in FIG. 1 and FIG. 2, the semiconductor device according to the present embodiment is a fully-depleted MOSFET (Metal-Oxide-Semiconductor Field-Effect-Transistor, MOS field effect transistor). The MOSFET according to the present embodiment includes, for example, a semiconductor substrate SB made of single crystal Si (silicon), a buried oxide film (insulating film) BOX formed over the semiconductor substrate SB, and a semiconductor layer (SOI layer) SL formed over the buried oxide film BOX. The stacked substrate made up of the semiconductor substrate SB, the buried oxide film BOX, and the semiconductor layer SL constitutes an SOI substrate. The buried oxide film BOX is made of, for example, a silicon oxide film. The semiconductor layer SL is made of, for example, a silicon film. A thickness of the semiconductor layer SL is 20 nm or less. Though the illustration thereof is omitted in FIG. 1, trenches adjacent to the patterned semiconductor layer SL are filled with element isolation regions made of, for example, a silicon oxide film.

A gate electrode GE1 is formed over the semiconductor layer SL via a gate insulating film GI. The gate insulating film GI is made of, for example, a silicon oxide film, and the gate electrode GE1 is made of, for example, a polysilicon film. The gate electrode GE1 extends in a Y direction, which is a direction along each of a main surface of the semiconductor substrate SB and an upper surface of the semiconductor layer SL. The Y direction is a direction along each of the main surface of the semiconductor substrate SB and the upper surface of the semiconductor layer SL. The gate electrode GE1 and the gate insulating film GI have the same planar layout, and overlap with each other in a plan view. Therefore, the gate insulating film GI extends in the Y direction. Also, an area where an active region of the semiconductor layer SL overlaps with the gate electrode GE1 is almost the same as an area where the active region of the semiconductor layer SL overlaps with the gate insulating film GI. The gate insulating film GI does not include ferroelectric.

In a transverse direction of the gate electrode GE1, that is, in the X direction which is the direction along each of the main surface of the semiconductor substrate SB and the upper surface of the semiconductor layer SL and orthogonal to the Y direction in a plan view, a pair of source/drain regions SD is formed in the semiconductor layer SL next to the gate electrode GE1. Namely, two source/drain regions SD adjacent in the X direction are formed in the semiconductor layer SL, and the gate electrode GE1 is formed immediately above the semiconductor layer SL which is a channel region between the source/drain regions SD. In other words, the source/drain regions SD are formed so as to sandwich the gate electrode GE1 in a plan view. Actually, one of the source/drain regions SD functions as a source region, and the other functions as a drain region. The source/drain regions SD are n-type semiconductor regions in which an n-type impurity (for example, P (phosphorus) or As (arsenic)) is introduced into the semiconductor layer SL. The source/drain regions SD are formed from the upper surface to the lower surface of the semiconductor layer SL.

As shown in FIG. 2, each side surface of the gate electrode GE1 is covered with a sidewall spacer SW. The sidewall spacer SW is made of, for example, a silicon oxide film, a silicon nitride film, or a stacked film thereof. Part of the upper surface of the source/drain region SD is exposed from the sidewall spacer SW. Note that the source/drain regions SD may have a so-called LDD (Lightly Doped Drain) structure. Also, though not shown here, a silicide layer may be formed on each of the upper surface of the gate electrode GE1 and the upper surfaces of the source/drain regions SD exposed from the gate electrode GE1 and the sidewall spacers SW.

An interlayer insulating film IL1 is formed over the semiconductor layer SL so as to cover the semiconductor layer SL, the element isolation region (not shown), the sidewall spacers SW, and the gate electrode GE1. The interlayer insulating film IL1 is mainly made of, for example, a silicon oxide film. An upper surface of the interlayer insulating film IL1 is planarized at a position higher than the upper surface of the gate electrode GE1. A contact hole (connection hole) CH1 penetrating from the upper surface of the interlayer insulating film IL1 to the upper surface of the gate electrode GE1 is formed in the interlayer insulating film IL1. Though not shown here, contact holes penetrating from the upper surface of the interlayer insulating film IL1 to the respective upper surfaces of the pair of source/drain regions SD are also formed in the interlayer insulating film IL1.

A plug (contact plug, conductive connection portion) PG1 is buried in the contact hole CH1 immediately above the gate electrode GE1. The plug PG1 is electrically connected to the gate electrode GE1. The plug PG1 may be directly connected to the gate electrode GE1, but when a silicide layer (not shown) that covers the upper surface of the gate electrode GE1 is formed, the plug PG1 is connected to the gate electrode GE1 via the silicide layer. An upper surface of the plug PG1 is planarized at the same height as the upper surface of the interlayer insulating film IL1. As with the plug PG1, a plug is buried also in a contact hole (not shown) immediately above each of the source/drain regions SD.

The plug PG1 is made of, for example, W (tungsten) or Cu (copper) as a main conductor film. Side and bottom surfaces of the main conductor film may be covered with a barrier conductor film. As the barrier conductor film, a conductor film made of Ta (tantalum), Ti (titanium), a nitride thereof, or the like can be used. In this case, the plug PG1 is composed of the main conductor film and the barrier conductor film. In the figure, for simplification of the drawing, the barrier conductor film and the main conductor film constituting the plug PG1 are integrally shown without distinction.

A ferroelectric film FR is formed on the interlayer insulating film IL1 and the plug PG1, and the entire upper surface of the plug PG1 is covered with the ferroelectric film FR. Most of the upper surface of the interlayer insulating film IL1 is exposed from the ferroelectric film FR. Namely, the ferroelectric film FR is formed immediately above the plug PG1. A thickness of the ferroelectric film FR is, for example, 1 to 200 nm.

Here, a ferroelectric is a material in which the internal polarization is spontaneously aligned when an external electric field having a strength equal to or higher than a certain threshold electric field (this is referred to as a coercive electric field) is applied to the material, and the amount of internal polarization is maintained at a certain value even if the external electric field is then set to 0. Therefore, it is clearly distinguished from a normal dielectric. The dielectrics cause dielectric polarization only in an electric field, while the ferroelectrics cause dielectric polarization once an external electric field is applied, and the dielectric polarization is maintained. Namely, the ferroelectric is a substance that causes spontaneous polarization. When the electric field is 0, the polarization of the dielectric is also 0, but the polarization of the ferroelectric is not always 0 even when the electric field is 0. Furthermore, ferroelectrics have a higher dielectric constant (relative dielectric constant) than dielectrics. Thus, ferroelectrics have properties similar to ferromagnets.

Further, the magnitude of the dielectric polarization of the ferroelectric is not determined only by the strength of the current electric field, but depends on the past state. For example, even when an electric field in a predetermined direction is applied to the ferroelectric film to change the polarization of the ferroelectric film upward and the electric field is then weakened to 0, the polarization of the ferroelectric film does not change and is kept directed upward. Thereafter, even when a high-strength electric field is applied to the ferroelectric film in the opposite direction to change the polarization of the ferroelectric film downward and the electric field is then weakened to 0, the polarization of the ferroelectric film does not change and is kept directed downward. As described above, for example, when the electric field is 0, the polarization (electric displacement) does not have a direction (value) determined in accordance with the value of the electric field, but depends on the past state. This phenomenon is referred to as hysteresis (see the solid line in FIG. 24). The polarization of the ferroelectric film that is maintained when the magnitude of the electric field is so small that the polarization state of the ferroelectric film does not change or the magnitude thereof is 0 is referred to as remanent polarization.

Here, the "negative capacitance" of a ferroelectric referred to in this application will be described. The negative capacitance of a ferroelectric is a new concept proposed in the known document 1 and is a state peculiar to the ferroelectric. Namely, in the stacked structure of metal/ferroelectric/metal, the polarization of the ferroelectric with respect to the external electric field has a characteristic accompanied by hysteresis as described above (see the solid line in FIG. 24). However, in the stacked structure of metal/ferroelectric/(metal)/dielectric/metal, the polarization has an S-shaped characteristic without hysteresis as shown by the broken line in FIG. 24 by appropriately adjusting the ferroelectric film thickness and the dielectric film thickness. The negative capacitance state is a region where the derivative of polarization with respect to the electric field is negative (near the electric field of 0 in the broken line in FIG. 24).

However, although there is no hysteresis in the negative capacitance state, three states of ±remanent polarization or zero polarization can be taken in the region where the electric field is 0. Which state to take depends on the application history of the electric field. In any case, by forming a stacked structure of metal/ferroelectric/(metal)/dielectric/metal, the negative capacitance state where the derivative of the polarization with respect to the electric field in the S-shaped polarization characteristic shown by the broken line in FIG. 24 becomes negative appears. In the negative capacitance state, the direction of the electric field inside the ferroelectric is opposite to the direction of polarization (the direction from the negative polarization electric field to the positive polarization electric field is positive).

As shown in FIG. 2, an interlayer insulating film IL2 is formed over the interlayer insulating film IL1 and the ferroelectric film FR. The interlayer insulating film IL2 is mainly made of, for example, a silicon oxide film. An upper surface of the interlayer insulating film IL2 is planarized at a position higher than the upper surface of the ferroelectric film FR. A contact hole (connection hole) CH2 penetrating from the upper surface of the interlayer insulating film IL2 to the upper surface of the ferroelectric film FR is formed in the interlayer insulating film IL2. Though not shown here, a contact hole that exposes the upper surface of the plug connected to each of the pair of source/drain regions SD and penetrates through the interlayer insulating film IL2 is also formed.

A plug (contact plug, conductive connection portion) PG2 is buried in the contact hole CH2 immediately above the ferroelectric film FR. The contact hole CH2 and the plug PG2 are formed so as to overlap with each of the ferroelectric film FR, the contact hole CH1, and the plug PG1 in a plan view. Here, the plug PG2 is directly connected to the upper surface of the ferroelectric film FR. The plug PG2 is made of, for example, W (tungsten) or Cu (copper) as a main conductor film. Side and bottom surfaces of the main conductor film may be covered with a barrier conductor film. As the barrier conductor film, a conductor film made of Ta (tantalum), Ti (titanium), a nitride thereof, or the like can be used. In this case, the plug PG2 is composed of the main conductor film and the barrier conductor film. An upper surface of the plug PG2 is planarized at the same height as the upper surface of the interlayer insulating film IL2. As with the plug PG2, a plug is buried also in the contact hole (not shown) immediately above the plug connected to each of the source/drain regions SD.

A stacked plug made up of the plug PG1 electrically connected to the gate electrode GE1, the ferroelectric film FR stacked on the plug PG1, and the plug PG2 stacked on the ferroelectric film FR constitutes a gate plug used to apply a gate voltage to the gate electrode GE1. Namely, the gate plug penetrates through the interlayer insulating films IL1 and IL2. Though not shown, the stacked plugs connected to the source/drain regions SD are a source plug and a drain plug used to apply a voltage to the source region and the drain region. The source plug and the drain plug have a structure in which two plugs (conductive films, conductive connection portions) are stacked in direct contact, while the gate plug differs in that the ferroelectric film FR is interposed between the two plugs (conductive films, conductive connection portions). The plugs PG1 and PG2 and the gate plug including them are columnar patterns extending in the Z direction. The Z direction is a direction (perpendicular direction, vertical direction) orthogonal to both the X direction and the Y direction.

The main feature of the present embodiment is that the ferroelectric film FR is interposed between the plugs PG1 and PG2 constituting the gate plug. Another feature of the present embodiment is that an area where a contact surface between the plug PG1 and the ferroelectric film FR and a contact surface between the ferroelectric film FR and the plug PG2 overlap in a plan view is smaller than an area where the gate electrode GE1 and the semiconductor layer SL serving as an active region overlap.

As a material of the ferroelectric film FR, for example, an oxide of Hf (hafnium), an oxide of Ti (titanium), or an oxide of Zr (zirconium) can be used. Specifically, $HfO_2$, Pb (Zr, Ti)$O_X$, $(Bi, La)_4Ti_3O_{12}$, or $Bi_4Ti_3O_{12}$ can be used. In other words, $HfO_2$, $PbZr_{1-Y}Ti_YO_X$, $Bi_{4-Y}La_YTi_3O_{12}$, or $Bi_4Ti_3O_{12}$ can be used. Here, the value of Y is represented by $0 \leq Y \leq 1$. However, when the ferroelectric film FR is made of $HfO_2$, the $HfO_2$ needs to contain an orthorhombic crystal. This is because $HfO_2$ whose crystal structure is not orthorhombic, but is trimetric, cubic, or tetragonal is a dielectric, and $HfO_2$ which is a ferroelectric is only orthorhombic $HfO_2$.

Also, when the ferroelectric film FR is made of $HfO_2$, Y (yttrium), Zr (zirconium), N (nitrogen), Al (aluminum), Gd (gadolinium), Sr (strontium), La (lanthanum), or Si (silicon) may be added (introduced) to the ferroelectric film FR. By adding these, it is possible to increase the ratio of the orthorhombic crystal in the crystals constituting the ferroelectric film FR, lower the crystallization temperature, and further prevent the leakage current from flowing through the insulating film around the ferroelectric film FR. Namely, the dielectric properties of the ferroelectric film FR can be enhanced.

In FIG. 1 and FIG. 2, the gate plug is connected to the gate electrode GE1 immediately above the semiconductor layer SL serving as an active region, but the gate plug may be connected to the upper surface of the gate electrode GE1 formed immediately above the element isolation region (not shown) adjacent to the semiconductor layer SL. In that case, the gate electrode GE1 extends from above the semiconductor layer SL to above the element isolation region.

Though not shown, a wiring electrically connected to the plug PG2 is formed on the plug PG2. Also, the case where the second-layer plug is stacked on the upper surface of the first-layer plug connected to each of the source/drain regions SD has been described here, but a wiring may be connected to the upper surface of the first-layer plug. In that case, the wiring is formed at a height adjacent to the ferroelectric film FR.

<Manufacturing Method of Semiconductor Device>

The manufacturing method of the semiconductor device according to the present embodiment will be described below with reference to FIG. 3 to FIG. 8. FIG. 3 to FIG. 8 are cross-sectional views for describing the manufacturing process of the semiconductor device according to the present embodiment.

Figure 3:
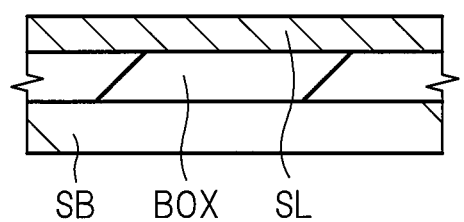
FIG. 3 is a cross-sectional view showing a manufacturing process of the semiconductor device according to the first embodiment of the present invention.

First, as shown in FIG. 3, an SOI substrate which is a stacked substrate made up of the semiconductor substrate SB and the buried oxide film BOX and the semiconductor layer SL sequentially stacked over the semiconductor substrate SB is prepared. The thickness of the semiconductor layer SL is 20 nm or less. If the semiconductor layer SL is thicker than 20 nm in the prepared substrate, the film thickness is adjusted by solution etching or RIE (Reactive Ion Etching). For example, when the semiconductor layer SL is silicon, the thickness of the semiconductor layer SL can be easily adjusted to a desired thickness by oxidizing the excess silicon layer into $SiO_2$ by heating it in an oxygen stream and then removing the $SiO_2$ with diluted hydrofluoric acid or the like.

The semiconductor substrate SB is usually made of single crystal silicon. The buried oxide film BOX is made of, for example, a silicon oxide film. The semiconductor layer SL is made of, for example, a silicon (Si) film. In addition, a germanium (Ge) film, a silicon germanium ($Si_{1-x}Ge_x$) film (0<x<1), or a semiconductor material such as indium arsenide, gallium arsenide, or indium gallium arsenide ($In_{1-y}Ga_yAs$) (0≤y≤1) may be used. Subsequently, the semiconductor layer SL is processed by the photolithography technique and the etching method, thereby exposing part of the upper surface of the buried oxide film BOX. Namely, a trench is formed around the semiconductor layer SL. Subsequently, the trench is filled with a silicon oxide film to form the element isolation region (not shown) made of the silicon oxide film.

Figure 4:
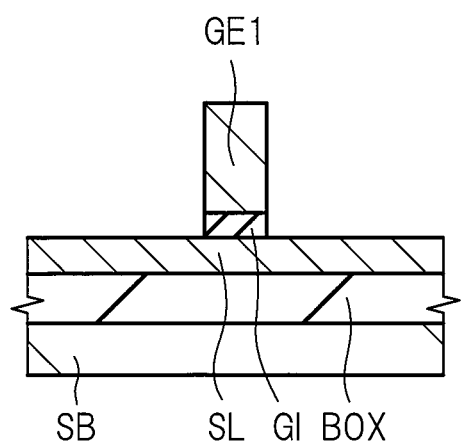
FIG. 4 is a cross-sectional view showing the manufacturing process of the semiconductor device continued from FIG. 3.

Next, as shown in FIG. 4, an insulating film and a polysilicon film (conductive film) are sequentially formed over the upper surface of the semiconductor layer SL. The insulating film is made of, for example, a silicon oxide film, and is formed by using, for example, the CVD (Chemical Vapor Deposition) method. The polysilicon film is formed by, for example, the CVD method. Note that the material of the conductive film is not limited to polysilicon. By using a film made of TiN or TaN formed by the CVD method or the like, a favorable conductive film having lower electric resistivity than polysilicon can be formed. It is desirable that TiN is formed by reacting with nitrogen plasma or ammonia gas by the CVD method using titanium chloride (IV) $TiCl_4$ as a material and TaN is formed by reacting with nitrogen plasma or ammonia gas by the CVD method using tantalum chloride (V) $TaCl_5$ as a material.

Subsequently, the conductive film such as polysilicon and the insulating film are processed by using the photolithography technique and the etching method, thereby exposing the upper surface of the semiconductor layer SL. For processing the conductive film made of polysilicon, TiN, or TaN, the RIE using a halogen-based gas is preferable. In particular, chlorine gas ($Cl_2$) is more preferable because it has a high selectivity to the underlying insulating film. The underlying oxide film is preferably etched with a solution of diluted hydrofluoric acid (about 1 wt %). Thus, the gate electrode GE1 made of the conductive film extending in the Y direction and the gate insulating film GI made of the insulating film extending in the Y direction immediately below the gate electrode GE1 are formed. Namely, the stacked pattern made up of the gate insulating film GI and the gate electrode GE1 is formed.

Figure 5:
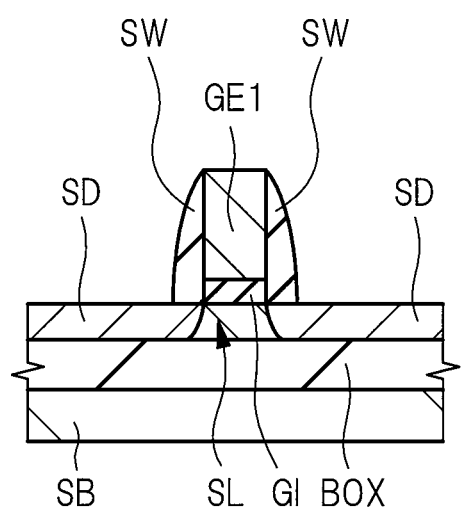
FIG. 5 is a cross-sectional view showing the manufacturing process of the semiconductor device continued from FIG. 4.

Next, as shown in FIG. 5, ion implantation is performed to the upper surface of the semiconductor layer SL with using the gate electrode GE1 as a mask. Thus, a pair of extension regions, which is an n-type semiconductor region, is formed in the upper surface of the semiconductor layer SL. The extension region can be formed by implanting an n-type impurity (for example, P (phosphorus) or As (arsenic)).

Subsequently, an insulating film is formed over the semiconductor layer SL by using, for example, the CVD method. The insulating film is mainly made of, for example, a silicon nitride film. Thereafter, dry etching is performed to remove part of the insulating film. Thereby, the upper surfaces of the element isolation film (not shown), the semiconductor layer SL, and the gate electrode GE1 are exposed. Thus, the sidewall spacers SW made of the insulating film are formed in a self-aligning manner on the side surfaces of the stacked body including the gate insulating film GI and the gate electrode GE1.

Subsequently, ion implantation is performed to the upper surface of the semiconductor layer SL with using the gate electrode GE1 and the sidewall spacers SW as a mask. Here, a pair of diffusion regions, which is an n-type semiconductor region, is formed in the upper surface of the semiconductor layer SL by implanting an n-type impurity (for example, P (phosphorus) or As (arsenic)). In the step of forming the diffusion region, ion implantation is performed at a higher impurity concentration than that in the ion implantation step performed when forming the extension region. Thereafter, heat treatment for diffusing and activating the impurity in the semiconductor layer SL is performed. The heat treatment is desirably performed in a nitrogen atmosphere, and the heat treatment temperature is desirably 800 to 1000° C. For the heat treatment, the short-time heat treatment of about 1 ms to 1 s may be performed by the rapid heat treatment using the lamp heating method or the laser heating method. Note that, when the gate electrode GE1 is a conductive film made of TiN, TaN, or the like, the implanted dopant hardly affects the conductive characteristics.

Consequently, the source/drain regions SD including the diffusion regions and the extension regions are formed. The source/drain regions SD and the gate electrode GE1 constitute an SOI MOSFET. The MOSFET is a transistor having the surface of the semiconductor layer SL as a channel. Note that, in the figure, the diffusion regions and the extension regions are not separately shown, and the source/drain regions SD in which they are integrated are shown.

Next, a silicide layer (not shown) that covers the each upper surface of the gate electrode GE1 and the source/drain regions SD is formed by the well-known salicide (Salicide: Self Align silicide) process. Here, first, a metal film that covers the semiconductor layer SL and the gate electrode GE1 is formed. Then, by performing heat treatment to the semiconductor substrate SB, the surfaces of the semiconductor layer SL and the gate electrode GE1 react with the metal film. Thereby, the silicide layer is formed.

Figure 6:
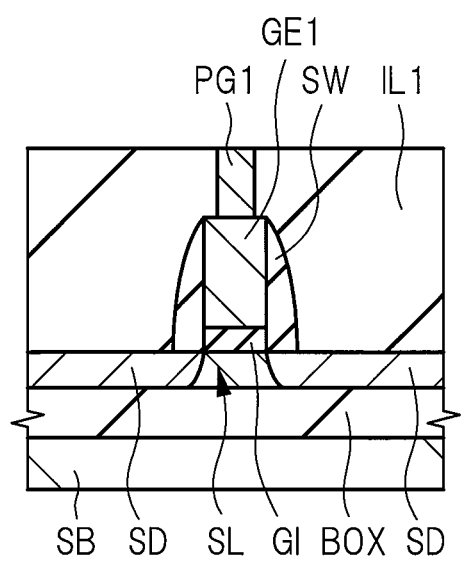
FIG. 6 is a cross-sectional view showing the manufacturing process of the semiconductor device continued from FIG. 5.

Next, as shown in FIG. 6, a thin liner film (not shown) made of, for example, a silicon nitride film and a thick interlayer insulating film made of a silicon oxide film are sequentially formed over the main surface of the semiconductor substrate SB. Here, the liner film and the interlayer insulating film are collectively illustrated as the interlayer insulating film IL1. The liner film and the interlayer insulating film can be formed by, for example, the CVD method. The interlayer insulating film IL1 has a thickness larger than the height of the stacked body made up of the gate insulating film GI and the gate electrode GE1. Thereafter, the upper surface of the interlayer insulating film IL1 is planarized by, for example, the CMP (Chemical Mechanical Polishing) method. In this planarization step, the gate electrode GE1 is not exposed.

Subsequently, a plurality of contact holes CH1 penetrating through the interlayer insulating film IL1 are formed by using the photolithography technique and the dry etching method. At the bottom of each contact hole CH1, part of the upper surface of the source/drain region SD or part of the upper surface of the gate electrode GE1 is exposed from the interlayer insulating film IL1. Note that the contact hole CH1 immediately above the source/drain region SD is formed in a region not shown in the figure.

Subsequently, the conductive plug PG1 mainly made of tungsten (W) or the like is formed in each contact hole CH1 as a conductive connection portion. The plug PG1 has a stacked structure of a barrier conductor film (for example, a titanium film, a titanium nitride film, or a stacked film thereof) and a main conductor film (for example, a tungsten film) located on the barrier conductor film. The barrier conductor film and the main conductor film can be formed by, for example, the sputtering method. The main conductor film may be made of Cu (copper), and in that case, the main conductor film can be formed by the plating method. The plug PG1 is electrically connected to the gate electrode GE1.

Figure 7:
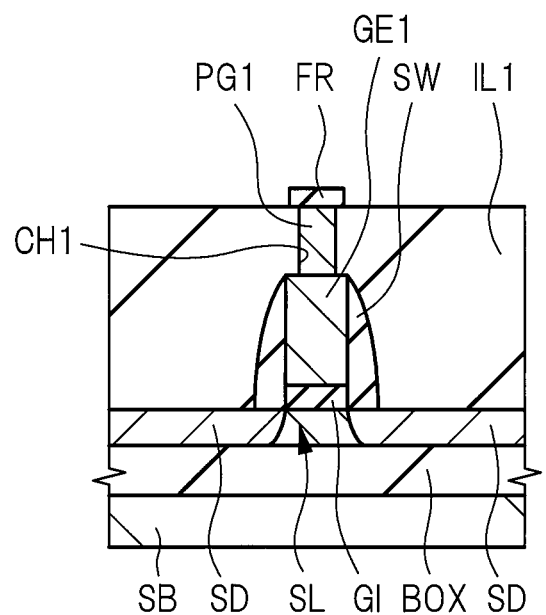
FIG. 7 is a cross-sectional view showing the manufacturing process of the semiconductor device continued from FIG. 6.

Next, as shown in FIG. 7, the ferroelectric film FR is formed on the interlayer insulating film IL1 and the plug PG1. Namely, after the ferroelectric film FR is formed over the interlayer insulating film IL1 and the plug PG1 by, for example, the sputtering method, the ALD (Atomic-Layer-Deposition) method, or the CVD method, the ferroelectric film FR is processed by the photolithography technique and the etching method, thereby exposing the upper surface of the interlayer insulating film IL1. The pattern of the ferroelectric film FR thus formed covers the entire upper surface of the plug PG1, and remains only near the upper surface of the plug PG1. The thickness of the ferroelectric film FR is, for example, 1 to 200 nm.

Figure 8:
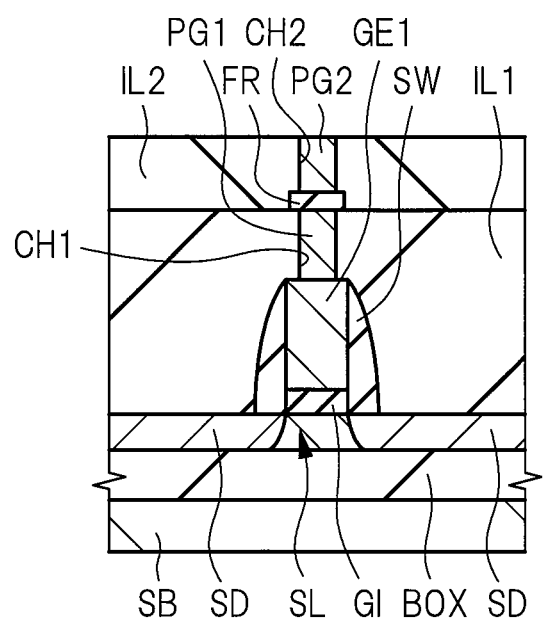
FIG. 8 is a cross-sectional view showing the manufacturing process of the semiconductor device continued from FIG. 7.

Next, as shown in FIG. 8, the interlayer insulating film IL2 made of, for example, a silicon oxide film is formed over the main surface of the semiconductor substrate SB. The interlayer insulating film IL2 can be formed by, for example, the CVD method. Thereafter, the upper surface of the interlayer insulating film IL2 is planarized by using, for example, the CMP method. In this planarization step, the ferroelectric film FR is not exposed.

Subsequently, a plurality of contact holes CH2 penetrating through the interlayer insulating film IL2 are formed by using the photolithography technique and the dry etching method. At the bottom of each contact hole CH2, the plug connected to the source/drain region SD or part of the upper surface of the ferroelectric film FR is exposed from the interlayer insulating film IL2. Note that the contact hole CH2 immediately above the source/drain region SD is formed in a region not shown in the figure.

Subsequently, the conductive plug PG2 mainly made of tungsten (W) or the like is formed in each contact hole CH2 as a conductive connection portion. The plug PG2 has a stacked structure of a barrier conductor film (for example, a titanium film, a titanium nitride film, or a stacked film thereof) and a main conductor film (for example, a tungsten film) located on the barrier conductor film. The barrier conductor film and the main conductor film can be formed by, for example, the sputtering method. The main conductor film may be made of Cu (copper), and in that case, the main conductor film can be formed by the plating method. A lower surface of the plug PG2 is connected to the ferroelectric film FR. An area where a contact surface between the plug PG1 and the ferroelectric film FR and a contact surface between the ferroelectric film FR and the plug PG2 overlap in a plan view is smaller than an area where the gate electrode GE1 and the semiconductor layer SL serving as an active region overlap.

In the subsequent steps, the wiring connected to the upper surface of the plug PG2 and the stacked wiring on the interlayer insulating film IL2 are formed, whereby the semiconductor device according to the present embodiment is completed.

<Effects of the Present Embodiment>

Effects of the present embodiment will be described below with reference to FIG. 22 to FIG. 24.

In order to reduce the power consumption of the MOSFET, it is most effective to reduce the power supply voltage. However, even though the power supply voltage is simply lowered, the drive current of the MOSFET decreases when the power supply voltage approaches the threshold voltage, resulting in the occurrence of the problem of the decrease in the operation speed. The threshold voltage is a voltage applied to the gate electrode necessary to turn on the MOSFET, and is a potential difference between the gate and the source.

Figure 22:
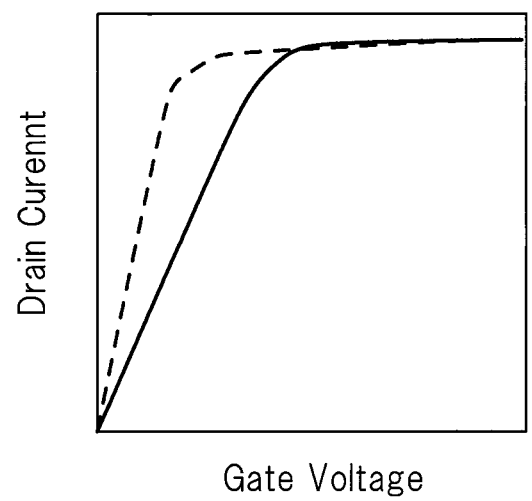
FIG. 22 is a graph showing a relationship between a gate voltage and a drain current of a MOSFET.

Here, FIG. 22 is a graph showing the relationship between the gate voltage and the drain current of the MOSFET. The horizontal axis of the graph in FIG. 22 represents the gate voltage, and the vertical axis represents the drain current. Note that FIG. 22 is a semilogarithmic graph, and the vertical axis of the graph shows the drain current on a logarithmic scale.

In order to reduce the power consumption of the MOSFET while preventing the decrease in the drive current and the operation speed of the MOSFET, it is important to make the drain current rise sharply with respect to a small increase of the gate voltage at the time when the gate voltage lower than the threshold voltage Vth is applied (subthreshold region, cut-off region). In other words, it is important to reduce the amount of increase in the voltage required to increase the value of the drain current to a predetermined value during the period from when the gate voltage is applied in the state where the gate voltage is 0 V to when the gate voltage reaches the threshold voltage Vth. The reason will be described below.

The power consumption of the transistor is composed of two terms such as an operating power term and a standby power term. The operating power term is proportional to the square of the power supply voltage multiplied by the drain current. Therefore, when the gate voltage or the power supply voltage necessary to obtain a predetermined drain current can be reduced from $V_{dd1}$ to $V_{dd2}$ by reducing the S coefficient, the power consumption during the operation of the transistor decreases dramatically in proportion to the square of ($V_{dd2}/V_{dd1}$). Also, when the drain current when the power supply voltage is applied to the drain electrode and a voltage of 0 V is applied to the gate electrode is defined as an off-leakage current, the standby power is proportional to the off-leakage current multiplied by the power supply voltage. Therefore, the standby power decreases as the power supply voltage decreases. Furthermore, since the operating speed of a transistor is generally proportional to the drain current during operation, if the S coefficient can be reduced as a result, the power consumption can be dramatically reduced while improving the operating speed of the MOSFET.

When the gate voltage is equal to or lower than the threshold voltage Vth, the rise of the drain current changes exponentially with respect to the gate voltage, and the slope is called a subthreshold coefficient (S coefficient, S factor, subthreshold characteristic). As described in Y. Taur and T. H. Ning "Fundamentals of Modern VLSI Devices", (Cambridge University Press, U. S, 1998), p. 128, the S coefficient is defined as a gate voltage required to change the drain current by one order of magnitude at a gate voltage equal to or lower than the threshold voltage. As the S coefficient is reduced, the rise of the drain current can be sharpened, so that the switching characteristics can be improved. However, it is not possible to reduce the S coefficient without limit in the conventional MOSFET using a normal dielectric for the gate insulating film, and the S coefficient has a physical limit of 60 mV/decade. 60 mV/decade means that the increase in the gate voltage required to raise the drain current by one order of magnitude is 60 mV. In FIG. 22, a graph when the S coefficient is 60 mV/decade is shown by a solid line, and a graph when the S coefficient is smaller than 60 mV/decade is shown by a broken line.

The threshold voltage can be reduced even if the S coefficient is not reduced. However, in that case, the current flowing through the MOSFET in an off state (off current, off leakage current) increases, and thus the power consumption of the MOSFET cannot be reduced. In other words, for example, by adjusting the entire solid line graph shown in FIG. 22 so as to be shifted to the negative side of the horizontal axis, the value of the threshold voltage Vth can be lowered. In this case, however, the off current flows when the gate voltage is 0 V.

If the S coefficient is reduced and the rise of the drain current becomes sharp, the voltage at the time of turning on the MOSFET can be reduced while preventing the off current from flowing. Namely, it is possible to increase the operation speed of the MOSFET and reduce the power consumption of the MOSFET.

The S coefficient at room temperature (300 K) can be calculated by multiplying the value obtained by 1+(Cs/Cins) by 60 mV/decade. This is described in Non-Patent Document 6. Here, Cs is the capacitance of a semiconductor layer (for example, a semiconductor substrate) where a channel below a gate insulating film is formed, and Cins is the capacitance of the gate insulating film. Note that Cins may be the capacitance of the gate electrode. Namely, the S coefficient is determined by the relationship between the capacitance of the gate electrode or the gate insulating film and the capacitance of the semiconductor substrate. Specifically, the S coefficient can be reduced to less than 60 mV/decade when 1+(Cs/Cins) is a value less than 1. For that purpose, it is necessary to make either one of the capacitances Cs and Cins negative. Since it is difficult to make the capacitance Cs negative, the capacitance Cins of the gate electrode or the gate insulating film is made negative in order to reduce the S coefficient to less than 60 mV/decade.

Namely, when the capacitance Cins of the gate insulating film is a positive value, the lower limit of the S coefficient is 60 mV/decade, but when the capacitance Cins of the gate insulating film is a negative value, the S coefficient can be reduced to less than 60 mV/decade. Such a capacitance having a negative value is referred to as a negative capacitance. Also, the MOSFET in which the capacitance of the gate electrode or the gate insulating film has a negative value is referred to as a negative capacitance MOSFET in this specification. As described below by using the first comparative example, it is conceivable to use a ferroelectric film for a gate insulating film as one of the structures for realizing the negative capacitance MOSFET.

Figure 23:
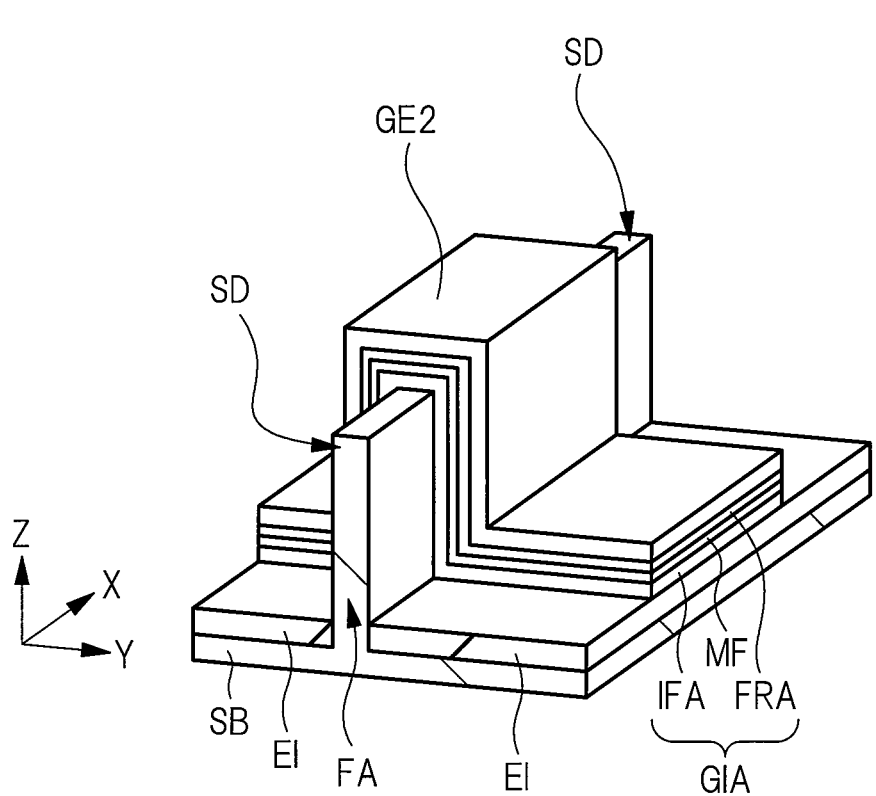
FIG. 23 is a cross-sectional view showing a semiconductor device according to a first comparative example.

Here, FIG. 23 shows a cross section of a MOSFET which is the semiconductor device according to the first comparative example. In the first comparative example, a ferroelectric film is used as part of a stacked film constituting a gate insulating film of a MOSFET. Here, a fin MOSFET is shown as the first comparative example. As described in a second embodiment described later, a fin MOSFET (FinFET) is a MOSFET in which source/drain regions and a channel region are formed in a wall-shaped semiconductor layer protruding upward from an upper surface of a semiconductor substrate.

As shown in FIG. 23, a fin (protruding portion, semiconductor layer) FA which is part of the semiconductor substrate SB is a rectangular parallelepiped semiconductor layer protruding on the semiconductor substrate SB. The fin FA extends in the X direction which is a direction along the main surface of the semiconductor substrate SB, and the width of the fin FA in the X direction, that is, the width in the longitudinal direction is larger than the width of the fin FA in the transverse direction, that is, the Y direction. The Y direction is a direction along the main surface of the semiconductor substrate SB, and is a direction orthogonal to the X direction in a plan view. Side surfaces of the lower portion of the fin FA on both sides in the Y direction are covered with element isolation regions EI embedded in trenches adjacent to the fin FA, and side surfaces of the upper portion of the fin FA are exposed from the element isolation regions EI. Namely, the fin FA protrudes upward from the element isolation region EI.

The side surfaces of the fin FA on both sides in the Y direction and the upper surface of the fin FA are covered with a gate insulating film GIA and a gate electrode GE2 extending in the Y direction. Each of the gate insulating film GIA and the gate electrode GE2 is sequentially stacked over the semiconductor substrate SB, and extends in the Y direction so as to straddle the fin FA. Each of the gate insulating film GIA and the gate electrode GE2 has the same layout in a plan view, and forms one stacked film. Further, in the fin FA exposed from the stacked film in the X direction, the source/drain regions SD are formed so as to sandwich the gate electrode GE2 in a plan view. The source/drain regions SD and the gate electrode GE2 constitute the fin MOSFET.

Here, the gate insulating film GIA is a stacked film made up of an insulating film IFA made of, for example, a silicon oxide film, a metal film MF on the insulating film IFA, and a ferroelectric film FRA on the metal film MF. The ferroelectric film FRA is polarized downward, a negative charge appears on the upper surface of the ferroelectric film FRA, and a positive charge appears on the lower surface of the ferroelectric film FRA, but the electric field inside the ferroelectric film FRA is directed upward. Therefore, the direction of the polarization of the ferroelectric film FRA is opposite to the direction of the electric field, so that the ferroelectric film FRA is in a negative capacitance state. Further, the capacitance $C_{GIA}$ of the gate insulating film GIA is a series combined capacitance of the capacitance ($C_{IFA}$) of the insulating film IFA and the ferroelectric film FRA ($C_{FRA}<0$) in a negative capacitance state, and can be expressed as $1/C_{GIA}=1/C_{IFA}+1/C_{FRA}$. Therefore, by adjusting the film thickness so as to satisfy $C_{GIA}<0$, the total combined capacitance of the gate insulating films GIA can be made negative. Therefore, it seems that it is easy to reduce the S coefficient to less than 60 mV/decade in the MOSFET of the first comparative example.

However, in the MOSFET using the ferroelectric film FRA for part of the gate insulating film as in the first comparative example, the S coefficient is less than 60 mV/decade only when the gate voltage is a very limited value, but the S coefficient becomes 60 mV/decade or more when the gate voltage is another value, and it is difficult to design the MOSFET and reduce the power consumption of the MOSFET. Namely, for example, the S coefficient is lower than 60 mV/decade only when the gate voltage is 0.5 V, and the S coefficient is 60 mV/decade or more when the gate voltage is another value. Such a phenomenon is reported also in Non-Patent Documents 2 and 3. The inventors of the present invention thought that the reason why the S coefficient cannot be stably reduced to less than 60 mV/decade is that the value of the remanent polarization due to the addition of the ferroelectric film to part of the gate insulating film is excessively large.

The inventors of the present invention have found from experiments and numerical analysis that it is necessary to adjust the polarization of the ferroelectric to about 1 μC/cm² in order to reduce the S coefficient to less than 60 mV/decade. On the other hand, the remanent polarization of known ferroelectric materials is about 5 to 30 μC/cm². Therefore, it is difficult to reduce the S coefficient to less than 60 mV/decade by using the negative capacitance effect of known ferroelectric materials. Further, in order to reduce the S coefficient, it is necessary to finely adjust the remanent polarization value in units of about 0.2 μC/cm², but the remanent polarization value of the ferroelectric material is the physical property value inherent in the material and the fine adjustment thereof is difficult. Therefore, it is extremely difficult to realize a transistor having the low S coefficient by using a ferroelectric film made of a well-known ferroelectric material for part of the gate insulating film as in the first comparative example.

The S coefficient of the MOSFET of the first comparative example is greatly affected by the area of the fin FA serving as an active region covered with the gate electrode GE2 via the ferroelectric film FRA. Since the remanent polarization value of the known ferroelectric material is about 5 to 30 μC/cm² and is excessively large, the S coefficient cannot be reduced to less than 60 mV/decade. However, it is difficult to develop a ferroelectric material having a lower remanent polarization value. Therefore, it is conceivable that the layout of the ferroelectric film FRA is adjusted so that the area of the ferroelectric film FRA becomes smaller than the area of the gate electrode GE2 covering the fin FA, whereby the influence given by the remanent polarization value of the ferroelectric material to the S coefficient is reduced and the S coefficient less than 60 mV/decade is realized. However, since the ferroelectric film FRA is formed as one of the layers constituting the gate insulating film GIA having a stacked structure in the first comparative example, the area of the ferroelectric film FRA is equal to the area of the gate electrode GE2 covering the fin FA, and it is difficult to adjust the area of the ferroelectric film FRA to be smaller.

Further, in order to realize the negative capacitance MOSFET, it is necessary that the region in which the channel of the MOSFET is formed, that is, the channel region is fully depleted. Full depletion means that electrons and hole carriers in the region between the source region and the drain region are all depleted. Such a MOSFET is referred to as a fully-depleted MOSFET. Therefore, since the channel is not fully depleted in the MOSFET in which a channel is formed in the upper surface of a so-called bulk silicon substrate other than the SOI MOSFET or the fin MOSFET, the negative capacitance MOSFET cannot be formed.

This is because the S coefficient can be calculated by multiplying the value obtained by 1+(Cs/Cins) by 60 mV/decade as described above. Since the bulk silicon substrate has a large thickness, the capacitance Cs of the substrate becomes very small in inverse proportion to the thickness. On the other hand, since the gate insulating film is thin, the absolute value of the capacitance Cins is large. Namely, when a channel is formed in a bulk silicon substrate, the value of 1+(Cs/Cins) becomes so close to 1 even if the capacitance Cins is set to a negative capacitance, and the S coefficient cannot be greatly reduced from 60 mV/decade. Therefore, the semiconductor layer in which a channel is formed needs to have a film thickness capable of being fully depleted, that is, 20 nm or less.

On the other hand, in the present embodiment, a ferroelectric having an area sufficiently smaller than the area of the gate electrode is connected. As shown in FIG. 1 and FIG. 2, no ferroelectric is used for the gate insulating film GI, and the ferroelectric film FR is interposed between the plugs PG1 and PG2 constituting the gate plug. Here, an area Sf where the contact surface between the plug PG1 and the ferroelectric film FR and the contact surface between the ferroelectric film FR and the plug PG2 overlap in a plan view is smaller than an area Sg where the gate electrode GE1 and the semiconductor layer SL serving as the active region overlap. In other words, the area Sg is the area of the active region covered with the gate electrode GE1, and the area Sf is the area where the upper surface of the plug PG1, the ferroelectric film FR, and the lower surface of the plug PG2 all overlap in a plan view.

The remanent polarization value sensed by the gate electrode GE1 from the ferroelectric film FR via the plug PG1 decreases according to an area ratio R1 of the gate electrode GE1 and the ferroelectric film FR. For example, when the area Sg is 10 and the area Sf is 1, the area ratio R1 of the area Sf to the area Sg, that is, Sf/Sg is 1/10. In this case, the remanent polarization value sensed by the gate electrode GE1 is 1/10 of the remanent polarization value of the ferroelectric film FR. Namely, a value RPr obtained by multiplying the area ratio of the area Sg and the area Sf (R1=Sf/Sg) by the remanent polarization value Pr is an effective remanent polarization value sensed by the gate electrode. In this manner, by connecting the ferroelectric film FR having the area Sf smaller than the area Sg to the gate electrode GE1 via the plug PG1 which is a gate plug, the remanent polarization value sensed by the gate electrode GE1 can be easily adjusted to about 1 μC/cm² by adjusting the value of the area ratio R1 as appropriate even when the ferroelectric film FR made of a material having a large remanent polarization value is used. Namely, the amount of polarization of the gate electrode GE1 can be substantially adjusted to about 1 μC/cm². Therefore, the S coefficient can be stably reduced to less than 60 mV/decade without reducing the remanent polarization value inherent in the ferroelectric film FR.

As described above, the power supply voltage of the MOSFET can be reduced by reducing the S coefficient and sharpening the rise of the drain current in the subthreshold region of the MOSFET. Therefore, the energy consumption of the MOSFET can be reduced to about 1/10 to 1/100 as compared with a known MOSFET. Thus, since the power supply voltage can be reduced, the performance of the semiconductor device can be improved.

Figure 24:
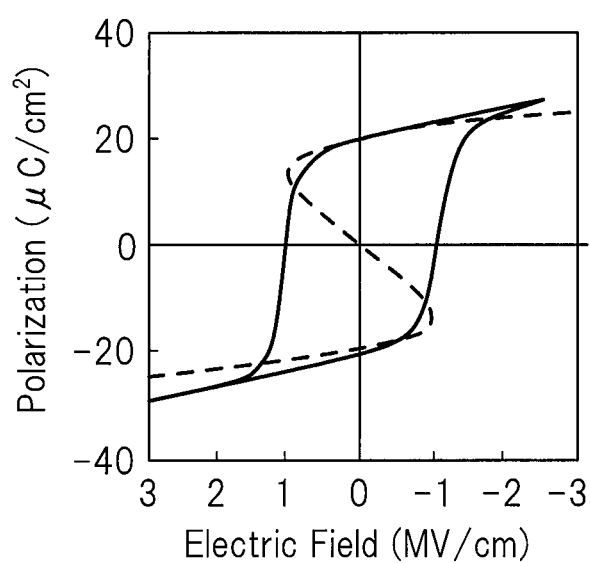
FIG. 24 is a graph showing a relationship between electric field and polarization in each of a second comparative example and the present embodiment.

Here, FIG. 24 is a graph showing the relationship between the electric field and the polarization in each of a second comparative example and the present embodiment. In FIG. 24, the graph of the second comparative example is shown by a solid line, and the graph of the present embodiment is shown by a broken line. The horizontal axis in FIG. 24 represents the electric field, and the vertical axis represents the polarization value.

It is conceivable that the graph of the polarization having the hysteresis characteristic does not pass through the origin as shown by the solid line in FIG. 24. Namely, the value of the polarization varies from the negative side to the positive side in a positive electric field, and varies from the positive side to the negative side in a negative electric field. When a relatively thick ferroelectric film is used, the polarization exhibits hysteresis characteristics as in the second comparative example.

However, the electric field-polarization characteristics of the ferroelectric used for the negative capacitance MOSFET pass through the origin as shown by the broken line graph in FIG. 24. In other words, the negative capacitance MOSFET cannot be realized unless the ferroelectric film has the polarization characteristics shown by the broken line graph.

Therefore, in the present embodiment, the adjustment is performed so that the polarization graph passes through the origin as shown by the broken line graph in FIG. 24. When described with reference to FIG. 1 and FIG. 2, the adjustment is, for example, adjusting the film thicknesses of the ferroelectric film FR and the gate insulating film GI so that the series combined capacitance $C_{total}$ of the capacitance $C_{FRA}$ of the ferroelectric film FR and the capacitance $C_{GI}$ of the gate insulating film GI and $1/C_{total}=1/C_{GI}+1/C_{FRA}$ become negative, changing the contact area between the ferroelectric film and the plugs on and below the film, inserting an insulating film (dielectric film) between the ferroelectric film and the conductive film (plug) on or below the ferroelectric film, or inserting a predetermined metal film between the ferroelectric film and the conductive film (plug) on or below the ferroelectric film. The insertion of the insulating film (dielectric film) or the metal film mentioned above will be described later in second and third modifications of the present embodiment.

The inventors of the present invention have found by experiment that the semiconductor device according to the present embodiment can reduce the S coefficient of the MOSFET to less than 60 mV/decade if the remanent polarization value of the ferroelectric film FR is 40 μC or less. More specifically, if a ferroelectric having a remanent polarization value of 4 to 40 μC/cm² and a ferroelectric having a coercive electric field of 0.6 to 1.6 MV/cm are used, the S coefficient can be reduced to less than 60 mV/decade according to the present embodiment.

Namely, by adjusting the thickness of the ferroelectric film FR or the area ratio R1 between the area Sg and the area Sf according to the remanent polarization value inherent in the material of the ferroelectric film FR, the S coefficient can be reduced to less than 60 mV/decade by using the negative capacitance effect of a wide variety of ferroelectric materials, without adjusting the remanent polarization value or the coercive electric field of the ferroelectric film FR. Note that, from the viewpoint of reducing the S coefficient to less than 60 mV/decade, it is necessary to reduce the film thickness of the ferroelectric film FR as an area ratio R2 of the area Sg to the area Sf, that is, a value of Sg/Sf increases. The area Sf can be easily adjusted by changing a cross-sectional area of each of the plug PG1 and the plug PG2 sandwiching the ferroelectric film FR.

The desirable value of the area ratio R2 is 1.1 to 20. The same goes for the modifications and other embodiments described below.

Note that, during the operation of the MOSFET of the present embodiment, the remanent polarization value of the ferroelectric film FR varies, for example, between −13 and 13 μC/cm² in the broken line graph shown in FIG. 24. In other words, during the operation of the MOSFET, the electric field is changed in the range of −1 to 1 MV/cm.

Also, in order to fully deplete the channel region, the thickness of the semiconductor layer SL where the channel is formed is set to 20 nm or less in the MOSFET of the present embodiment. In a MOSFET having an SOI structure in which the thickness of the semiconductor layer SL is larger than 20 nm, it is difficult to fully deplete the channel. In the present embodiment, during the operation of the MOSFET, the depletion occurs from the upper surface of the semiconductor layer SL to the upper surface of the buried oxide film BOX. In this manner, the negative capacitance MOSFET can be realized.

<First Modification>

In FIG. 1 to FIG. 8, the case where two plugs overlap with each other and a ferroelectric film is inserted therebetween has been described. However, as described below, a ferroelectric and a plug may be sequentially stacked on the gate electrode without interposing the plug.

Figure 9:
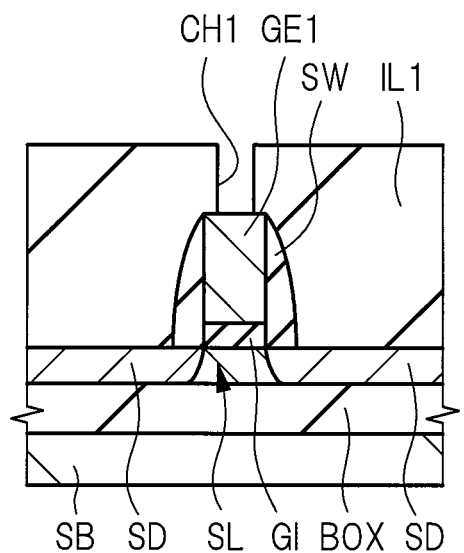
FIG. 9 is a cross-sectional view showing a manufacturing process of a semiconductor device according to a first modification of the first embodiment of the present invention.
Figure 10:
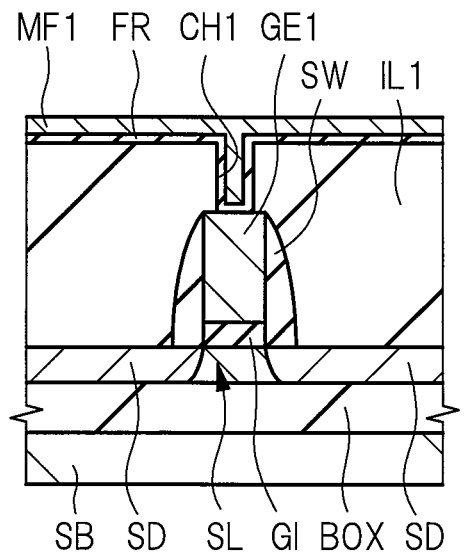
FIG. 10 is a cross-sectional view showing the manufacturing process of the semiconductor device continued from FIG. 9.
Figure 11:
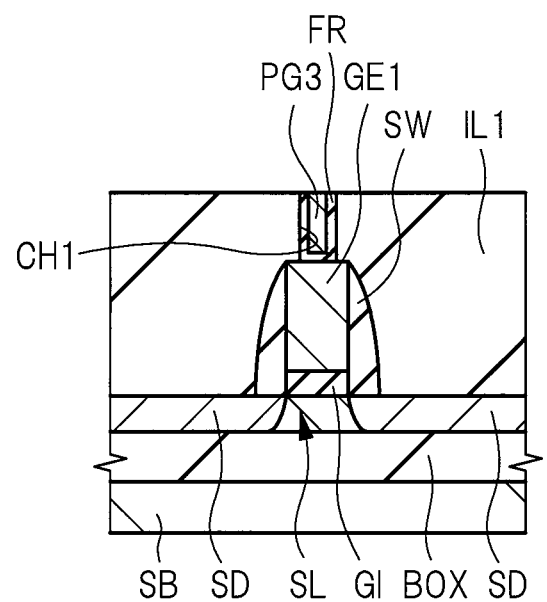
FIG. 11 is a cross-sectional view showing the manufacturing process of the semiconductor device continued from FIG. 10.

Hereinafter, a manufacturing process of a semiconductor device according to a first modification of the present embodiment will be described with reference to FIG. 9 to FIG. 11. FIG. 9 to FIG. 11 are cross-sectional views showing the manufacturing process of the semiconductor device according to the first modification of the present embodiment.

Here, first, the steps described with reference to FIG. 3 to FIG. 5 are performed. Next, as shown in FIG. 9, the interlayer insulating film IL1 and the contact hole CH1 are formed as described with reference to FIG. 6.

Next, as shown in FIG. 10, the ferroelectric film FR and the metal film MF1 are sequentially stacked over the interlayer insulating film IL1 and the gate electrode GE1 including the inside of the contact hole CH1. The ferroelectric film FR is formed by, for example, the CVD method. The metal film MF1 is formed by, for example, the sputtering method. The material of the metal film MF1 is mainly made of, for example, W (tungsten). Thus, the metal film MF1 is buried in the contact hole CH1 via the ferroelectric film FR. Namely, the metal film MF1 is buried in the contact hole CH1 via the ferroelectric film FR on the upper surface of the gate electrode GE1 or the upper surface of the silicide layer (not shown), which is the bottom surface of the contact hole CH1. Although the side and bottom surfaces of the contact hole CH1 are covered with the ferroelectric film FR, since the thickness of the ferroelectric film FR is smaller than half the diameter of the contact hole CH1, the inside of the contact hole CH1 is not completely filled with only the ferroelectric film FR. The thickness of the ferroelectric film FR is, for example, 1 to 200 nm.

Next, as shown in FIG. 11, the unnecessary ferroelectric film FR and metal film MF1 on the interlayer insulating film IL1 are removed by polishing using, for example, the CMP method. As a result, the upper surface of the interlayer insulating film IL1 is exposed, and a plug PG3 made of the metal film MF1 remaining in the contact hole CH1 is formed. Namely, the ferroelectric film FR and the plug PG3 in the contact hole CH1 constitute a gate plug.

In the subsequent steps, the wiring connected to the upper surface of the plug PG3 and the stacked wiring on the interlayer insulating film IL1 are formed, whereby the semiconductor device according to the present embodiment is completed.

Here, the area Sf where the upper surface of the gate electrode GE1, the ferroelectric film FR, and the lower surface of the plug PG3 all overlap with each other in a plan view is smaller than the area Sg of the active region covered with the gate electrode GE1. Therefore, the same effects as those of the semiconductor device described with reference to FIG. 1 to FIG. 8 can be obtained. As described above, the effects of the present embodiment can be obtained without interposing the plug between the gate electrode GE1 and the ferroelectric film FR. Note that, as shown in FIG. 2, the plug PG1 may be interposed between the ferroelectric film FR and the gate electrode GE1 of this modification.

<Second Modification>

Figure 12:
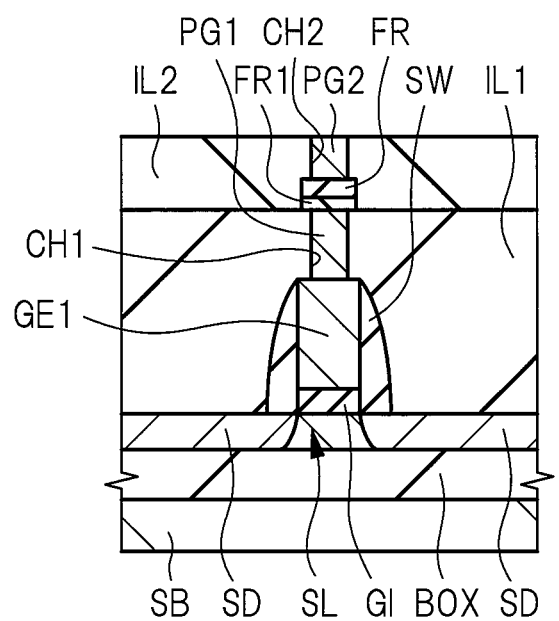
FIG. 12 is a cross-sectional view showing a semiconductor device according to a second modification of the first embodiment of the present invention.

In order to realize the negative capacitance MOSFET of the present embodiment, it is possible to adjust the dielectric properties of the ferroelectric film connected to the gate electrode. For this adjustment, an insulating film (dielectric film) is inserted between the ferroelectric film and a conductive film (plug) on or below the ferroelectric film in the second modification. Hereinafter, a semiconductor device according to the second modification of the present embodiment will be described with reference to FIG. 12. FIG. 12 is a cross-sectional view showing the semiconductor device according to the second modification of the present embodiment.

As shown in FIG. 12, here, a dielectric film FR1 and the ferroelectric film FR are sequentially stacked on the interlayer insulating film IL1 and the plug PG1. Other structures are the same as those shown in FIG. 2. Although the dielectric film FR1 is formed below the ferroelectric film FR in FIG. 12, the dielectric film FR1 may be formed on the ferroelectric film FR.

As a material of the dielectric film (insulating film) FR1, for example, $SiO_2$ (silicon oxide), non-orthorhombic $HfO_2$ (hafnium oxide), $Al_2O_3$ (alumina), or $ZrO_2$ (zirconium oxide) can be used. The non-orthorhombic $HfO_2$ refers to, for example, an $HfO_2$ film whose crystal structure is trimetric, cubic, or tetragonal.

By stacking the ferroelectric film FR and the dielectric film FR1 as described above, it is possible to adjust the dielectric properties of the stacked film composed of these films. Consequently, it is possible to bring the polarization characteristics of the negative capacitance MOSFET closer to the characteristics passing through the origin as shown by the broken line in FIG. 24. In other words, it becomes easy to realize the negative capacitance.

<Third Modification>

Figure 13:
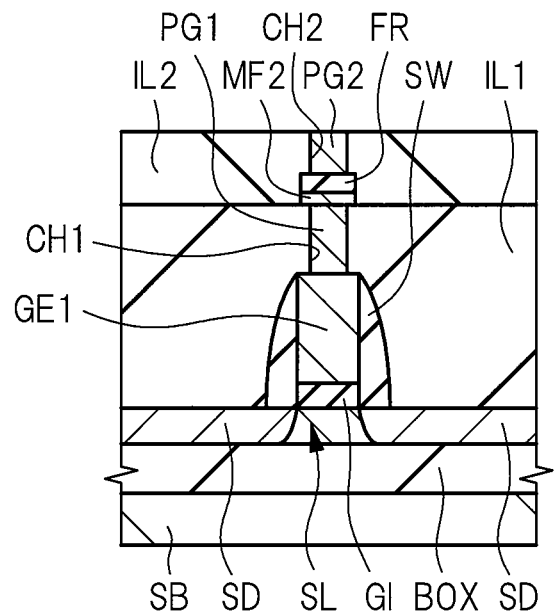
FIG. 13 is a cross-sectional view showing a semiconductor device according to a third modification of the first embodiment of the present invention.

In order to realize the negative capacitance MOSFET of the present embodiment, it is possible to adjust the dielectric properties of the ferroelectric film connected to the gate electrode. For this adjustment, a metal film is inserted between the ferroelectric film and a conductive film (plug) on or below the ferroelectric film in the third modification. Hereinafter, a semiconductor device according to the third modification of the present embodiment will be described with reference to FIG. 13. FIG. 13 is a cross-sectional view showing the semiconductor device according to the third modification of the present embodiment.

As shown in FIG. 13, here, a metal film MF2 and the ferroelectric film FR are sequentially stacked on the interlayer insulating film IL1 and the plug PG1. Other structures are the same as those shown in FIG. 2. Although the metal film MF2 is formed below the ferroelectric film FR in FIG. 13, the metal film MF2 may be formed on the ferroelectric film FR. Alternatively, the metal film MF may be stacked on and below the ferroelectric film FR.

As a material of the metal film, TiN (titanium nitride), TaN (tantalum nitride), Pt (platinum), $SrRuO_3$ (strontium ruthenate), W (tungsten), or the like can be used. In particular, when the ferroelectric film contains Hf, the polarization can be effectively adjusted by stacking the metal film on or below the ferroelectric film. Namely, when the metal film is made of TiN or TaN, the size of the crystal constituting the ferroelectric film can be increased. In addition, when the metal film is made of Pt or W, the proportion of the orthorhombic crystal can be increased in the crystal constituting the ferroelectric film. Also, when the metal film is made of $SrRuO_3$, since the metal film functions as a barrier metal film, it is possible to prevent atoms or molecules forming the ferroelectric film from diffusing into the plug overlapping with the ferroelectric film through the metal film.

By stacking the ferroelectric film FR and the metal film MF2 as described above, it is possible to adjust the dielectric properties of the stacked film made up of these films. Consequently, it is possible to bring the polarization characteristics of the negative capacitance MOSFET closer to the characteristics passing through the origin as shown by the broken line in FIG. 24. In other words, it becomes easy to realize the negative capacitance.

Second Embodiment

<Structure of Semiconductor Device>

Figure 14:
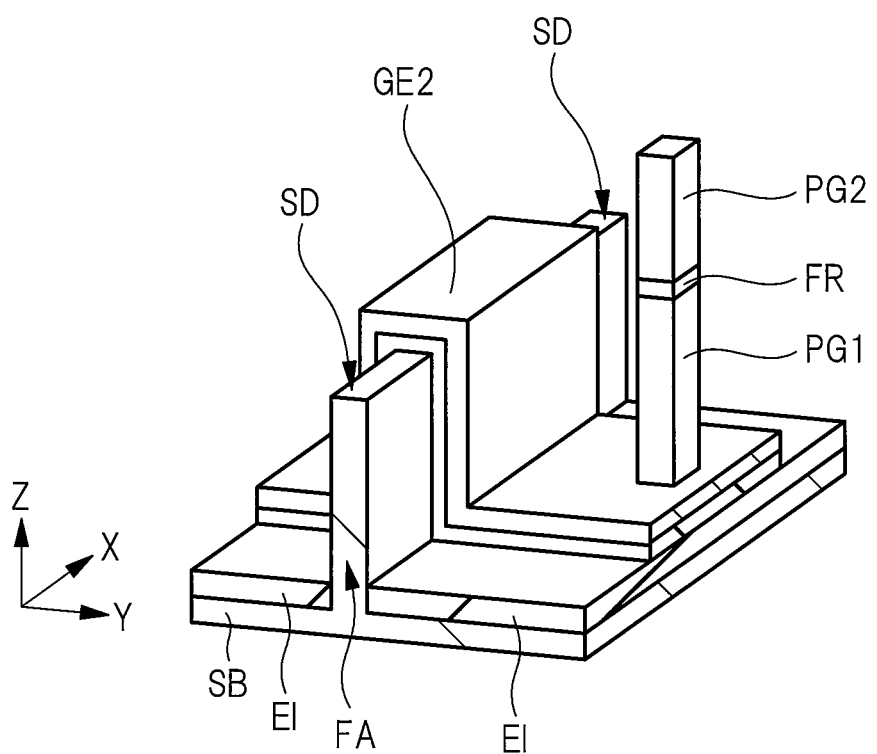
FIG. 14 is a perspective view showing a semiconductor device according to a second embodiment of the present invention.
Figure 15:
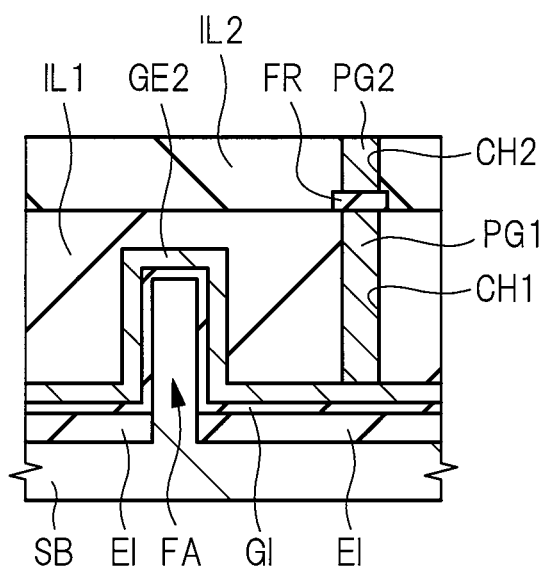
FIG. 15 is a cross-sectional view showing the semiconductor device according to the second embodiment of the present invention.

A structure of a semiconductor device according to a second embodiment will be described below with reference to FIG. 14 and FIG. 15. FIG. 14 is a perspective view of the semiconductor device according to the present embodiment. FIG. 15 is a cross-sectional view of the semiconductor device according to the present embodiment. Here, a case where the present invention is applied to a Fin MOSFET will be described. FIG. 15 shows a cross section of the MOSFET shown in FIG. 14 taken along the Y direction. Namely, FIG. 15 is a cross section along the transverse direction of the fin, and the cross section includes the gate electrode and the gate plug and does not include the source/drain regions.

As shown in FIG. 14 and FIG. 15, the Fin MOSFET, which is a semiconductor device according to the present embodiment, includes the semiconductor substrate SB and the fin FA which is part of the semiconductor substrate SB and protrudes upward from the upper surface of the semiconductor substrate SB. Namely, the fin FA is a protruding portion (convex portion) and is made of a rectangular parallelepiped semiconductor layer formed on the upper surface of the semiconductor substrate SB. The fin FA is a wall-shaped (plate-shaped) pattern extending in each of the X direction and the Z direction, and the width in the longitudinal direction (X direction) is larger than the width in the transverse direction (Y direction). The fin FA protrudes from the main surface of the semiconductor substrate SB in the vertical direction (Z direction) with respect to the main surface. The fin FA does not necessarily need to be a rectangular parallelepiped, and the corners at the upper end of the rectangle may be rounded in a cross-sectional view along the transverse direction.

In a plan view, the upper surface of the semiconductor substrate SB around the fin FA is covered with the element isolation region EI, and part including the upper end of the fin FA protrudes above the upper surface of the element isolation region EI. The fin FA on the element isolation region EI functions as an active region of the MOSFET. The semiconductor substrate SB is made of, for example, p-type single crystal silicon having a specific resistance of about 1 to 10 Ωcm. The width of the fin FA in the Y direction is 20 nm or less.

The gate electrode GE2 extending in the Y direction is formed over the fin FA via the gate insulating film GI. The gate electrode GE2 adjacent to the fin FA in the Y direction extends in the Y direction over the element isolation region EI. Part of each of the side surfaces of the fin FA on both sides in the Y direction and the upper surface of the fin FA between the side surfaces are covered with the stacked film made up of the gate insulating film GI and the gate electrode GE2. The stacked film is formed along the side surface and the upper surface of the fin FA so as to straddle the fin FA on the element isolation region EI.

Further, a pair of source/drain regions SD is formed in the side and upper surfaces of the fin FA exposed from the stacked film in the X direction so as to sandwich the gate electrode GE2 in a plan view. Each of the pair of source/drain regions SD is an n-type semiconductor region. Namely, the source/drain regions SD are regions in which an n-type impurity (for example, P (phosphorus) or As (arsenic)) is introduced into the fin FA. The gate electrode GE2 and the pair of source/drain regions SD constitute the fin MOSFET (FinFET).

FIG. 14 shows a structure in which one MOSFET is formed on one fin FA, but the fin FA may further extend in the X direction and a plurality of gate electrodes GE2 straddling the fin FA may be formed so as to be arranged in the X direction. In that case, the adjacent gate electrodes GE2 each constitute separate MOSFETs, and these MOSFETs may share part or all of the source/drain regions SD with each other. Namely, the adjacent MOSFETs may share the source region, for example.

The semiconductor substrate SB including the fin FA is made of, for example, single crystal silicon, each of the element isolation region EI and the gate insulating film GI is made of, for example, a silicon oxide film, and the gate electrode GE2 is made of, for example, polysilicon. The gate insulating film GI does not include a ferroelectric. The upper surface of the gate electrode GE2 and the respective surfaces of the source/drain regions SD may be covered with a silicide layer.

As shown in FIG. 15, the interlayer insulating films IL1 and IL2 are sequentially formed over the semiconductor substrate SB so as to cover the surface of the fin FA, the upper surface of the element isolation region EI, and the gate electrode GE2. The interlayer insulating film IL1 covers the uppermost surface of the gate electrode GE2, and the upper surface of the interlayer insulating film IL1 is planarized at the position higher than the gate electrode GE2. Further, the upper surface of the interlayer insulating film IL2 is also planarized. The interlayer insulating films IL1 and IL2 are mainly made of, for example, a silicon oxide film. The contact hole CH1 is formed in the interlayer insulating film IL1 so as to penetrate from the upper surface of the interlayer insulating film IL1 to the upper surface of the gate electrode GE2. Here, in FIG. 14 and FIG. 15, the contact hole CH1 is formed so as to expose the upper surface of the gate electrode GE2 immediately above the element isolation region EI in the region adjacent to the gate electrode GE2 covering the fin FA in the Y direction, instead of the surface of the gate electrode GE2 covering the fin FA. Namely, the contact hole CH1 and the fin FA are separated from each other in a plan view. However, the opening position of the contact hole CH1 is not limited to this, and the contact hole CH1 may be formed immediately above the surface of the gate electrode GE2 covering the uppermost surface of the fin FA, that is, the top side of the fin FA. In this case, the contact hole CH1 and the fin FA overlap in a plan view.

The plug PG1 is buried in the contact hole CH1. Also, the ferroelectric film FR connected to the entire upper surface of the plug PG1 is formed on the plug PG1, and the plug PG2 buried in the contact hole CH2 penetrating through the interlayer insulating film IL2 is connected to the upper surface of the ferroelectric film FR. The plug PG1, the ferroelectric film FR, and the plug PG2 constitute a gate plug for supplying a voltage to the gate electrode GE2, and the structure of the gate plug is the same as that in the first embodiment. Namely, the plug PG1 is directly connected to the upper surface of the gate electrode GE2, or is electrically connected thereto via a silicide layer. Also, the upper surface of the plug PG1 is connected to the ferroelectric film FR. Further, the plug PG1 and the plug PG2 overlap with each other in a plan view. The plugs PG1 and PG2 and the gate plug are columnar patterns extending in the Z direction. The thickness of the ferroelectric film FR is, for example, 1 to 200 nm.

Though not shown, the side surface of the gate electrode GE2 that is not opposed to the side surface of the fin FA may be covered with a sidewall spacer.

The main feature of the present embodiment is that the ferroelectric film FR is interposed between the plug PG1 and the plug PG2 constituting the gate plug. The area where the contact surface between the plug PG1 and the ferroelectric film FR and the contact surface between the ferroelectric film FR and the plug PG2 overlap in a plan view is smaller than the area where the gate electrode GE2 covers the fin FA serving as an active region.

<Manufacturing Process of Semiconductor Device>

Figure 16:
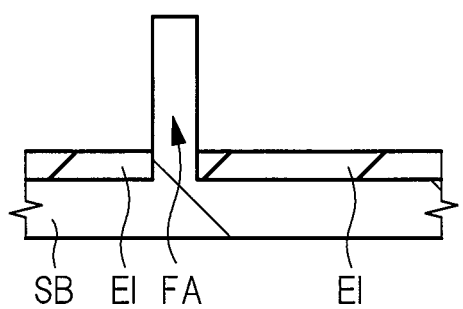
FIG. 16 is a cross-sectional view showing a manufacturing process of the semiconductor device according to the second embodiment of the present invention.
Figure 17:
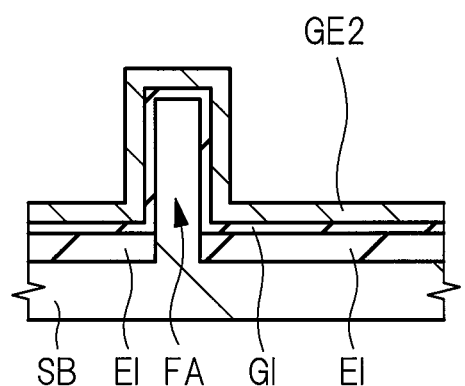
FIG. 17 is a cross-sectional view showing the manufacturing process of the semiconductor device continued from FIG. 16.
Figure 18:
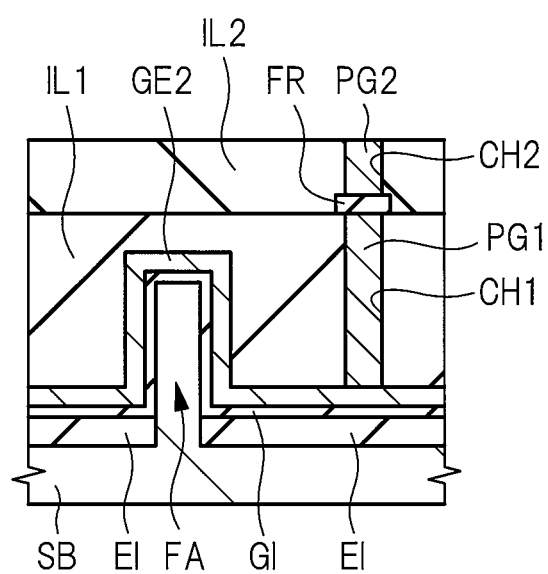
FIG. 18 is a cross-sectional view showing the manufacturing process of the semiconductor device continued from FIG. 17.

Hereinafter, a manufacturing method of the semiconductor device according to the present embodiment will be described with reference to FIG. 16 to FIG. 18. FIG. 16 to FIG. 18 are cross-sectional views showing the manufacturing process of the semiconductor device according to the present embodiment. FIG. 16 to FIG. 18 are views showing the cross section taken along the Y direction (see FIG. 14).

First, as shown in FIG. 16, the semiconductor substrate SB is prepared, and a hard mask extending in the X direction is formed over the main surface of the semiconductor substrate SB. The hard mask is made of, for example, a stacked film of a silicon nitride film and a silicon oxide film. Subsequently, the upper surface of the semiconductor substrate SB is recessed by performing dry etching using the hard mask as an etch stop mask. Thus, the fin (protruding portion) FA that is part of the semiconductor substrate SB is formed below the hard mask. The fin FA is a pattern made of a wall-shaped semiconductor layer extending in the X direction. Subsequently, a silicon oxide film is formed by, for example, the CVD method so as to cover the upper surface of the semiconductor substrate SB including the surface of the fin FA. Thereafter, the upper surface of the silicon oxide film is etched back to be recessed. Consequently, the position of the upper surface of the silicon oxide film becomes lower than the upper surface of the fin FA. Namely, part of the side surface and the upper surface of the fin FA are exposed. By the etch back step, the element isolation region EI made of the silicon oxide film is formed.

Subsequently, a p-type well is formed in the fin FA by introducing an impurity into the main surface of the semiconductor substrate SB by the ion implantation method. The p-type well is formed by implanting a p-type impurity (for example, B (boron)).

Next, as shown in FIG. 17, an insulating film is formed so as to cover the upper and side surfaces of the fin FA. The insulating film can be formed by, for example, the thermal oxidation method and is made of, for example, a silicon oxide film having a thickness of about 2 nm. Although the case where the insulating film is formed also on the element isolation region EI is described here, the insulating film is hardly formed on the upper surface of the element isolation region EI in some cases when the insulating film is formed by the oxidation method.

Subsequently, a semiconductor film or more preferably a metal film is deposited over the insulating film by, for example, the CVD method. The semiconductor film is made of, for example, a polysilicon film. As the metal film, a TiN film or a TaN film is deposited by the CVD method. Thereafter, a photoresist film (not shown) that covers just above part of the fin FA and extends in the Y direction is formed. Subsequently, by performing etching using the photoresist film as a mask, part of each of the insulating film and the semiconductor film is removed, thereby exposing part of each of the upper surface of the element isolation region EI and the surface of the fin FA. Consequently, the gate electrode GE2 made of the semiconductor film is formed on the fin FA. Also, the gate insulating film GI made of the insulating film between the gate electrode GE2 and the fin FA is formed.

Note that the case where the insulating film covering the surface of the fin FA exposed from the gate electrode GE2 is removed by the above-described etching and the subsequent cleaning process, so that the surface of the fin FA is exposed is described here, but the upper surface and side surfaces of the fin FA at the position not overlapping with the gate electrode GE2 in a plan view may be kept covered with the insulating film (gate insulating film GI).

Next, as shown in FIG. 18, ion implantation is performed to the upper surface of the fin FA with using the gate electrode GE2 as a mask. Thus, a pair of extension regions (not shown), which is an n-type semiconductor region, is formed in the upper surface of the fin FA. The extension region can be formed by implanting an n-type impurity (for example, As (arsenic)). Subsequently, sidewall spacers (not shown) that cover the side surfaces of the gate electrode GE2 are formed in the same manner as described with reference to FIG. 5.

Subsequently, ion implantation is performed to the upper surface of the fin FA with using the gate electrode GE2 and the sidewall spacers SW as a mask. Here, a pair of diffusion regions (not shown), which is an n-type semiconductor region, is formed in the upper surface of the fin FA by implanting an n-type impurity (for example, P (phosphorus) or As (arsenic)). In the step of forming the diffusion region, ion implantation is performed at a higher impurity concentration than that in the ion implantation step performed when forming the extension region. Thereafter, heat treatment for activation is performed to diffuse the impurity and the like in the semiconductor substrate SB. Consequently, a pair of source/drain regions SD (see FIG. 14) including the diffusion regions and the extension regions is formed. The source/drain regions SD and the gate electrode GE2 constitute a MOSFET. The MOSFET is a FINFET having the side surface and the upper surface of the fin FA as a channel region. Subsequently, a silicide layer (not shown) that covers each of the upper surface of the gate electrode GE2 and the surfaces of the source/drain regions is formed by the known salicide process.

Subsequently, the interlayer insulating films IL1 and IL2 and the gate plug connected to the gate electrode GE2 are formed in the same manner as described with reference to FIG. 6 to FIG. 8. Namely, a liner film (not shown) and the interlayer insulating film IL1 made of a silicon oxide film are formed over the main surface of the semiconductor substrate SB, and then the upper surface of the interlayer insulating film IL1 is planarized. In this planarization step, the gate electrode GE2 is not exposed. Subsequently, a plurality of contact holes CH1 penetrating through the interlayer insulating film IL1 are formed. At the bottom of each contact hole CH1, the upper surface of the gate electrode GE2 immediately above the element isolation region EI is exposed from the interlayer insulating film IL1. Also, in a region not shown, the contact holes CH1 for exposing the respective surfaces of the source/drain regions SD from the interlayer insulating film IL1 are also formed.

Subsequently, the conductive plug PG1 mainly made of tungsten (W) or the like is formed in each contact hole CH1 as a conductive connection portion. Thereafter, a pattern of the ferroelectric film FR covering the entire upper surface of the plug PG1 is formed on the plug PG1. Then, the interlayer insulating film IL2 is formed over the interlayer insulating film IL1, and subsequently, the plug PG2 penetrating through the interlayer insulating film IL2 and connected to the upper surface of the ferroelectric film FR is formed.

In the subsequent steps, the wiring connected to the upper surface of the plug PG2 and the stacked wiring on the interlayer insulating film IL2 are formed, whereby the semiconductor device according to the present embodiment is completed.

<Effects of Present Embodiment>

In the present embodiment, when forming the negative capacitance MOSFET, the ferroelectric film FR is inserted in the gate plug connected to the gate electrode GE2, instead of inserting the ferroelectric film in the gate insulating film GI shown in FIG. 15. In addition, the area Sf where the contact surface between the plug PG1 and the ferroelectric film FR and the contact surface between the ferroelectric film FR and the plug PG2 overlap in a plan view is smaller than the area Sg where the gate electrode GE2 covers the fin FA serving as an active region. By connecting the ferroelectric film FR having the area Sf smaller than the area Sg to the gate electrode GE2 via the plug PG1 which is a gate plug as described above, the remanent polarization value sensed by the gate electrode GE2 can be easily adjusted to about 1 $\mu C/cm^2$ even when the ferroelectric film FR made of a material having a large remanent polarization value is used.

Therefore, the S coefficient can be stably reduced to less than 60 mV/decade without reducing the remanent polarization value inherent in the ferroelectric film FR. Consequently, the rise of the drain current of the MOSFET in the subthreshold region can be made steep, so that the power consumption of the MOSFET can be reduced. Therefore, the performance of the semiconductor device can be improved.

Namely, in the present embodiment, the same effects as those in the first embodiment can be obtained. However, the fin MOSFET according to the present embodiment has an effect that the S coefficient can be significantly reduced as compared with the SOI MOSFET. This is because the SOI substrate includes a semiconductor layer (SOI layer) as well as a buried oxide film and a semiconductor substrate below the semiconductor layer and the capacitance of each of the buried oxide film and the semiconductor substrate reduces the capacitance Cs described in the first embodiment. Namely, the S coefficient can be calculated by multiplying the value obtained by 1+(Cs/Cins) by 60 mV/decade, but the reduction amount of the S coefficient becomes small when the capacitance Cs is reduced in the negative capacitance MOSFET in which (Cs/Cins) is a negative value.

On the other hand, in the fin MOSFET, the capacitance Cs is determined depending on the thickness of the fin FA in the Y direction, and the capacitance of the semiconductor substrate SB below the fin FA hardly affects the capacitance Cs. Therefore, in the fin MOSFET, the S coefficient can be easily reduced.

Also, in the MOSFET according to the present embodiment, the width of the fin FA, in which the channel is formed, in the transverse direction is set to 20 nm or less in order to fully deplete the channel region. In the FinFET having a width in the transverse direction larger than 20 nm, it is difficult to fully deplete the channel. Namely, here, during the operation of the MOSFET, the depletion occurs from one side surface of the fin FA in the transverse direction to the other side surface thereof. Thus, the negative capacitance MOSFET can be realized.

<First Modification>

FIG. 14 shows a structure in which a gate electrode straddles one fin, but a multi-fin transistor in which one gate electrode straddles a plurality of fins will be described here.

Figure 19:
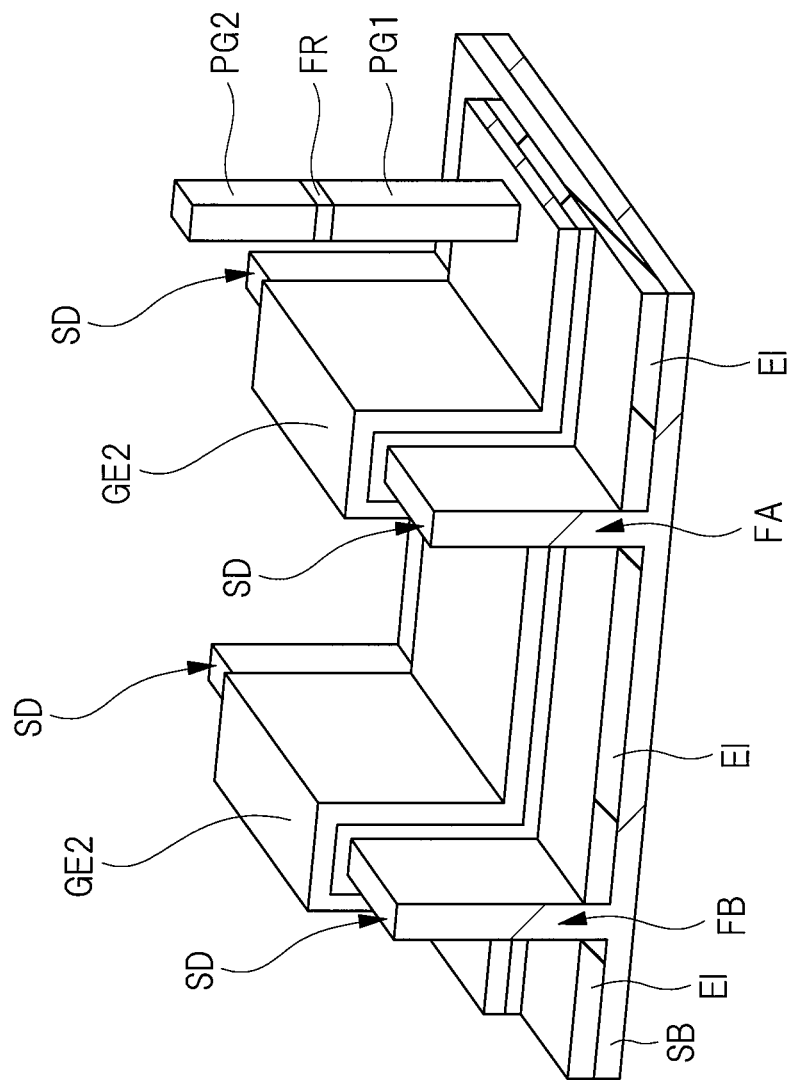
FIG. 19 is a cross-sectional view showing a semiconductor device according to a first modification of the second embodiment of the present invention.

FIG. 19 is a perspective view showing a semiconductor device according to a first modification of the present embodiment. The structure shown in FIG. 19 is the same as that described with reference to FIG. 14 to FIG. 18 except that two fins FA and FB are formed to be arranged in the Y direction on the semiconductor substrate SB and a FinFET is formed on each of the fins FA and FB. Namely, the MOSFET formed on each of the fins FA and FB has the same structure as the MOSFET described with reference to FIG. 14 and FIG. 15. However, the MOSFET formed on the fin FA and the MOSFET formed on the fin FB share the same gate electrode GE2, and one gate plug including the ferroelectric film FR is connected to the gate electrode GE2. The thickness of the ferroelectric film FR is, for example, 1 to 200 nm. Here, the area Sg is determined by the sum of the area of the fin FA covered with the gate electrode GE2 and the area of the fin FB covered with the gate electrode GE2.

Even when the gate electrode GE2 connected to the ferroelectric film FR constituting the gate plug via the plug PG1 constitutes the MOSFET formed on each of the plurality of fins FA and FB as in this modification, the effect of reducing the S coefficient and reducing the power consumption can be obtained in each of the MOSFETs.

<Second Modification>

Next, the case where the present invention is applied to a nanowire transistor which has a structure similar to the fin MOSFET and in which a channel region between a source region and a drain region is made of a cylindrical semiconductor layer extending in a lateral direction will be described.

Figure 20:
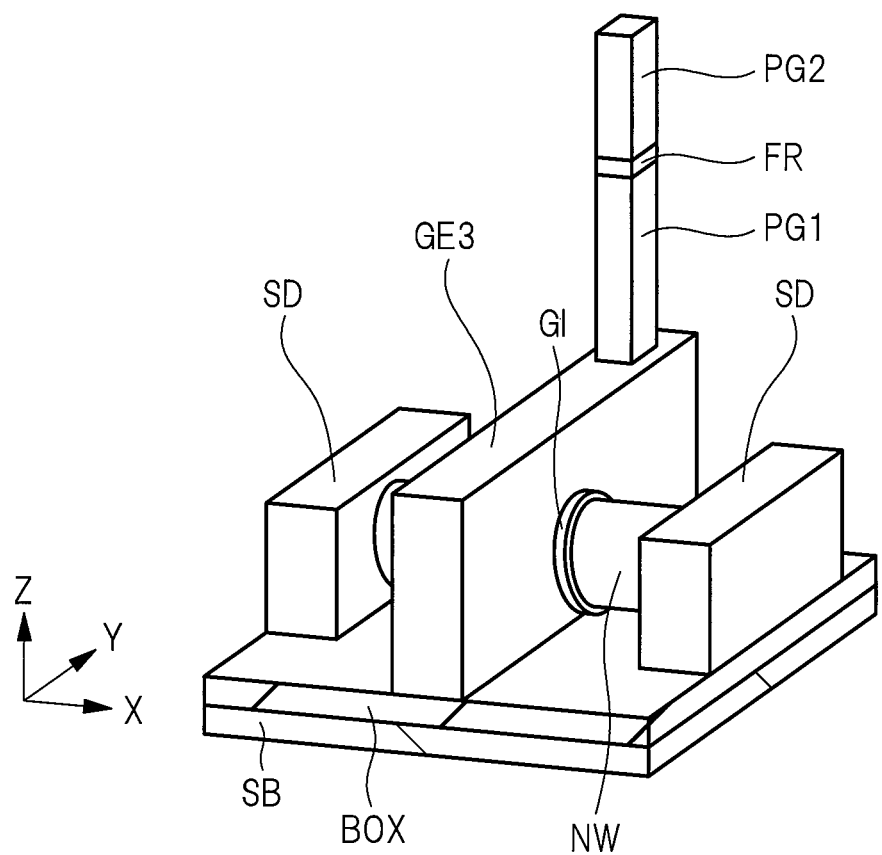
FIG. 20 is a perspective view showing a semiconductor device according to a second modification of the second embodiment of the present invention.

FIG. 20 is a perspective view showing a semiconductor device according to a second modification of the present embodiment. As shown in FIG. 20, the semiconductor device according to this modification has a stacked body including the semiconductor substrate SB and the buried oxide film BOX over the semiconductor substrate SB. On the buried oxide film BOX, the source/drain regions SD which are a pair of patterns separated from each other are formed. Namely, one of the pair of patterns constitutes a source region, and the other constitutes a drain region. The patterns are each made of a rectangular parallelepiped semiconductor film.

The source/drain regions SD are connected to each other by a nanowire NW which is a cylindrical semiconductor layer formed on the buried oxide film BOX and extending in the X direction. Namely, both ends of the nanowire NW in the longitudinal direction are connected to each of the source/drain regions SD. The width (diameter) of the nanowire NW in the Y direction is smaller than the width of the source/drain region SD in the Y direction and the thickness of the source/drain region SD in the Z direction. Actually, it is conceivable that the cross section of the nanowire NW has a shape close to a trapezoid.

Part of the surface of the nanowire NW between the source/drain regions SD is covered with a gate electrode GE3 via the gate insulating film GI. The gate insulating film GI and the gate electrode GE3 are formed so as to surround the periphery of the cylindrical nanowire NW in a cross section taken along the Y direction and the Z direction. Namely, the gate insulating film GI and the gate electrode GE3 surround the periphery of the nanowire (semiconductor layer) NW in the diameter direction. However, the gate insulating film GI and the gate electrode GE3 do not need to completely surround the periphery of the nanowire NW in the cross section. For example, it is conceivable that the lower part of the nanowire NW is not covered with the gate insulating film GI and the gate electrode GE3.

The gate electrode GE3 is a high impurity concentration semiconductor film or a metal film with a rectangular parallelepiped shape extending in the Y direction on the buried oxide film BOX. More specifically, when the gate electrode GE3 is a high impurity concentration semiconductor film, it may be a phosphorus-doped polysilicon film, or when the gate electrode GE3 is a metal film, it is made of TiN or TaN. In order to uniformly adhere and deposit the gate electrode GE3 on the surface of the cylindrical or quadrangular prismatic nanowire NW, it is preferable to form a conductive film constituting the gate electrode GE3 by the CVD method. Also, when polysilicon is used for the gate electrode GE3, an impurity (phosphorus or arsenic for n-type and boron for p-type) of about $10^{20}$ cm$^{-3}$ needs to be introduced in order to make the polysilicon have the electrical conductivity of 1 to 10 mΩcm. However, when this impurity introduction is performed by the ion implantation method, there is a concern that the impurity may be implanted only in part of the side surface of the cylindrical or quadrangular prismatic nanowire NW. Therefore, the formation of the polysilicon electrode around the nanowire NW is achieved by supplying a gas containing impurity to silane gas, which is a material of the polysilicon, at the time of film formation by the CVD method. As the gas, $PH_3$ (phosphine) is used when the impurity to be introduced is P (phosphorus), $AsH_3$ (arsine) is used when the impurity is As (arsenic), and $BH_3$ (borane) is used when the impurity is B (boron). The source/drain regions SD and the gate electrode GE3 constitute the nanowire MOSFET.

The gate plug having a structure in which the plug PG1, the ferroelectric film FR, and the plug PG2 are sequentially stacked is connected to the upper surface of the gate electrode GE3. The thickness of the ferroelectric film FR is, for example, 1 to 200 nm. The area Sf where the contact surface between the plug PG1 and the ferroelectric film FR and the contact surface between the ferroelectric film FR and the plug PG2 overlap in a plan view is smaller than the area Sg where the gate electrode GE3 covers the nanowire NW serving as an active region. By connecting the ferroelectric film FR having the area Sf smaller than the area Sg to the gate electrode GE3 via the plug PG1 which is a gate plug as described above, the remanent polarization value sensed by the gate electrode GE3 can be easily adjusted to about 1 μC/cm$^2$ even when the ferroelectric film FR made of a material having a large remanent polarization value is used. Therefore, the effect of reducing the S coefficient and reducing the power consumption can be obtained even in the nanowire transistor.

<Third Modification>

Next, the case where the present invention is applied to a multi-nanowire transistor in which a plurality of nanowire transistors are stacked in the perpendicular direction will be described.

Figure 21:
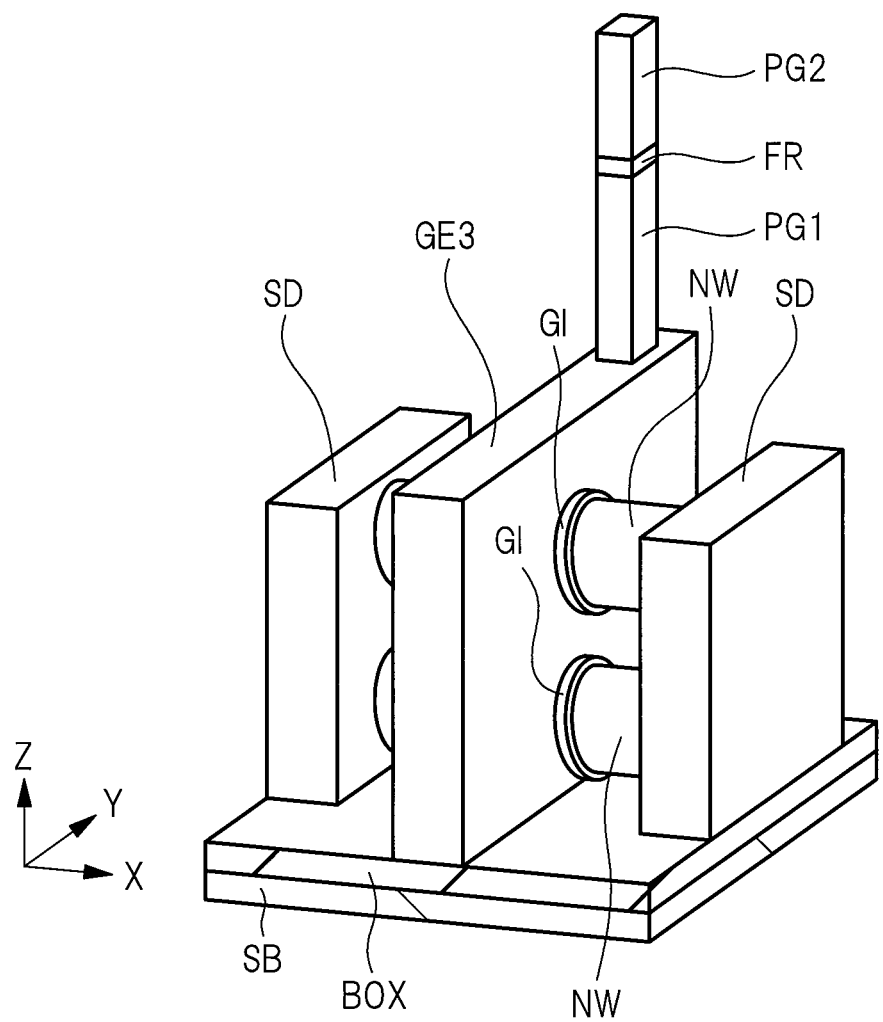
FIG. 21 is a perspective view showing a semiconductor device according to a third modification of the second embodiment of the present invention.

FIG. 21 is a perspective view showing a semiconductor device according to a third modification of the present embodiment. As shown in FIG. 21, the semiconductor device according to this modification has a structure in which a nanowire transistor is further stacked on the nanowire transistor described with reference to FIG. 20. Each of the two stacked nanowire transistors shares the source/drain regions SD and the gate electrode GE3. Therefore, each of the source/drain regions SD and the gate electrode GE3 extends upward as compared with the structure shown in FIG. 20. The source/drain regions SD are connected to each other by two nanowires NW spaced apart from each other in the perpendicular direction (Z direction). The two nanowires NW penetrate through the gate electrode GE3, and the gate insulating film GI is interposed between each nanowire NW and the gate electrode GE3. Namely, in the cross section along the Y direction and the Z direction, the periphery of each of the two nanowires NW is surrounded by the gate insulating film GI and the gate electrode GE3.

The gate plug having a structure in which the plug PG1, the ferroelectric film FR, and the plug PG2 are sequentially stacked is connected to the upper surface of the gate electrode GE3. The thickness of the ferroelectric film FR is, for example, 1 to 200 nm. The area Sf where the contact surface between the plug PG1 and the ferroelectric film FR and the contact surface between the ferroelectric film FR and the plug PG2 overlap in a plan view is smaller than the area Sg where the gate electrode GE3 covers the nanowire NW serving as an active region. The area Sg mentioned here is obtained by the sum of the areas where the two nanowires NW are covered with the gate electrode GE3.

By connecting the ferroelectric film FR having the area Sf smaller than the area Sg to the gate electrode GE3 via the plug PG1 which is a gate plug as described above, the remanent polarization value sensed by the gate electrode GE3 can be easily adjusted to about 1 $\mu C/cm^2$ even when the ferroelectric film FR made of a material having a large remanent polarization value is used. Therefore, the effect of reducing the S coefficient and reducing the power consumption can be obtained even in the nanowire transistor.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the first to third modifications of the first embodiment may be applied to the second embodiment. Also, although the n-channel MOSFET has been described in the first and second embodiments, the present invention may be applied to a p-channel MOSFET having p-type source/drain regions.

Also, although the MOSFET in which the source/drain regions are formed after the gate electrode is formed has been described in the first and second embodiments, the present invention may be applied to the manufacturing process in which the gate insulating film and the gate electrode are formed after forming the source/drain regions.

The present invention can be widely used for a semiconductor device including a transistor.

The invention claimed is:

1. A semiconductor device comprising:
a semiconductor layer having a thickness of 20 nm or less;
a gate electrode formed over the semiconductor layer via a gate insulating film;
a pair of source/drain regions in which an impurity of a first conductivity type is introduced into the semiconductor layer next to the gate electrode;
a first plug electrically connected to the gate electrode;
a ferroelectric film connected to an upper surface of the first plug; and
a second plug connected to an upper surface of the ferroelectric film,
wherein the gate electrode and the source/drain regions constitute a first field effect transistor, and
a first area where a contact surface between the first plug and the ferroelectric film and a contact surface between the ferroelectric film and the second plug overlap in a plan view is smaller than a second area where the gate electrode and the semiconductor layer overlap.

2. The semiconductor device according to claim 1, further comprising:
a semiconductor substrate; and
a first insulating film over the semiconductor substrate,
wherein the semiconductor layer is formed over the first insulating film.

3. A semiconductor device comprising:
a semiconductor substrate;
a protruding portion which is part of the semiconductor substrate, protrudes upward from an upper surface of the semiconductor substrate, and extends in a first direction along the upper surface of the semiconductor substrate;
a gate electrode which is formed over an upper surface of the protruding portion via a gate insulating film and extends in a second direction orthogonal to the first direction;
a pair of source/drain regions of a first conductivity type formed in a surface of the protruding portion so as to sandwich the protruding portion immediately below the gate electrode in the first direction;
a first plug electrically connected to the gate electrode;
a ferroelectric film connected to an upper surface of the first plug; and
a second plug connected to an upper surface of the ferroelectric film,
wherein the gate electrode and the source/drain regions constitute a field effect transistor,
a width of the protruding portion in the second direction is 20 nm or less, and
a first area where a contact surface between the first plug and the ferroelectric film and a contact surface between the ferroelectric film and the second plug overlap in a plan view is smaller than a second area where the gate electrode covers the protruding portion.

4. The semiconductor device according to claim 3, wherein a dielectric film is interposed between the first plug and the ferroelectric film or between the ferroelectric film and the second plug.

5. The semiconductor device according to claim 4, wherein the dielectric film is made of an oxide film of Ti or Zr or an Hf oxide film whose crystal structure is trimetric, cubic, or tetragonal.

6. The semiconductor device according to claim 3, wherein the ferroelectric film contains orthorhombic $HfO_2$.

7. The semiconductor device according to claim 6, wherein Y, Zr, N, Al, Gd, Sr, La, or Si is added to the ferroelectric film.

8. The semiconductor device according to claim 3, wherein a metal film containing TiN, TaN, Pt, or $SrRuO_3$ is interposed between the first plug and the ferroelectric film or between the ferroelectric film and the second plug.

9. The semiconductor device according to claim 3, further comprising an interlayer insulating film formed over the gate electrode and having a connection hole penetrating from an upper surface to a lower surface,
wherein the ferroelectric film covers a bottom surface and a side surface of the connection hole, and
the connection hole is filled with the ferroelectric film and the second plug.

10. A semiconductor device comprising:
a semiconductor substrate;
a first insulating film over the semiconductor substrate;

a cylindrical first semiconductor layer formed over the first insulating film and extending in a first direction along an upper surface of the semiconductor substrate;

a gate electrode surrounding a periphery of the first semiconductor layer in a diameter direction via a first gate insulating film;

a pair of source/drain regions which is connected to both ends of the first semiconductor layer in an extending direction, respectively, and to which an impurity of a first conductivity type is introduced;

a first plug electrically connected to the gate electrode;

a ferroelectric film connected to an upper surface of the first plug; and a second plug connected to an upper surface of the ferroelectric film, wherein the gate electrode and the source/drain regions constitute a first field effect transistor, and a first area where a contact surface between the first plug and the ferroelectric film and a contact surface between the ferroelectric film and the second plug overlap in a plan view is smaller than a second area where the gate electrode covers the first semiconductor layer.

11. The semiconductor device according to claim 10, further comprising a second semiconductor layer formed over the first semiconductor layer so as to be separated from the first semiconductor layer, wherein the second semiconductor layer has a cylindrical structure extending in the first direction, both ends of the second semiconductor layer are connected to the pair of source/drain regions, respectively, and a periphery of the second semiconductor layer in a diameter direction is surrounded by the gate electrode via a second gate insulating film.

* * * * *